(12) United States Patent
Paak et al.

(10) Patent No.: US 9,755,049 B2
(45) Date of Patent: Sep. 5, 2017

(54) SEMICONDUCTOR DEVICES INCLUDING ACTIVE PATTERNS HAVING DIFFERENT PITCHES AND METHODS OF FABRICATING THE SAME

(71) Applicant: Samsung Electronics Co., Ltd., Suwon-Si, Gyeonggi-do (KR)

(72) Inventors: Sunhom Steve Paak, Seoul (KR); Sung Min Kim, Incheon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/000,425

(22) Filed: Jan. 19, 2016

(65) Prior Publication Data
US 2016/0211168 A1 Jul. 21, 2016

(30) Foreign Application Priority Data
Jan. 21, 2015 (KR) .................. 10-2015-0009822

(51) Int. Cl.
*H01L 29/66* (2006.01)
*H01L 21/308* (2006.01)
(Continued)

(52) U.S. Cl.
CPC ...... *H01L 29/6656* (2013.01); *H01L 21/3086* (2013.01); *H01L 21/76232* (2013.01);
(Continued)

(58) Field of Classification Search
CPC ............ H01L 29/6656; H01L 21/3086; H01L 21/76232; H01L 27/11524;
(Continued)

(56) References Cited

U.S. PATENT DOCUMENTS 7,611,980 B2  11/2009  Wells et al.
8,057,692 B2  11/2011  Park et al.
(Continued)

FOREIGN PATENT DOCUMENTS

JP      2013-153064 A    8/2013
KR   10-2011-0076221 A   7/2011
(Continued)

*Primary Examiner* — Scott B Geyer
(74) *Attorney, Agent, or Firm* — Ward and Smith, P.A.

(57) ABSTRACT

Methods for fabricating semiconductor devices are provided including sequentially stacking hardmask layers, a first sacrificial layer, and a second sacrificial layer on a substrate, forming first mandrels on the first sacrificial layer by etching the second sacrificial layer, forming first spacers on side walls of the first mandrels, forming a photoresist pattern disposed outside a region from which the first mandrels have been removed, forming second and third mandrels by etching the first sacrificial layer using the first spacers and the photoresist pattern as respective etching masks, forming second and third spacers on side walls of the second and third mandrels, forming first and second active patterns respectively having first and second pitches by etching the hardmask layer and at least a portion of the substrate, and forming a device isolation layer so that upper portions of the first and second active patterns protrude therefrom.

20 Claims, 29 Drawing Sheets

(51) Int. Cl.
*H01L 27/11524* (2017.01)
*H01L 27/11536* (2017.01)
*H01L 21/762* (2006.01)
*H01L 27/11* (2006.01)

(52) U.S. Cl.
CPC .. *H01L 27/11524* (2013.01); *H01L 27/11536* (2013.01); *H01L 27/1104* (2013.01)

(58) Field of Classification Search
CPC .......... H01L 27/11536; H01L 27/1104; H01L 21/0337; H01L 21/033; H01L 21/0331; H01L 21/0332; H01L 21/0334
See application file for complete search history.

(56) References Cited

U.S. PATENT DOCUMENTS

| | | | |
|---|---|---|---|
| 8,216,949 B2 | 7/2012 | Abatchev et al. | |
| 8,309,462 B1 | 11/2012 | Yoshida et al. | |
| 8,609,324 B2 | 12/2013 | Tran | |
| 8,877,647 B2 * | 11/2014 | Tsai | H01L 21/306 216/47 |
| 8,912,097 B2 | 12/2014 | Martin et al. | |
| 2010/0252875 A1 | 10/2010 | Shirota | |
| 2012/0168955 A1 | 7/2012 | Chen et al. | |
| 2012/0205750 A1 | 8/2012 | Sudo | |
| 2012/0208361 A1 | 8/2012 | Ha | |
| 2012/0252185 A1 * | 10/2012 | Lee | H01L 21/0332 438/424 |
| 2014/0073137 A1 | 3/2014 | Cinnor et al. | |
| 2014/0087563 A1 | 3/2014 | Sant et al. | |
| 2014/0091434 A1 | 4/2014 | Hopkins | |
| 2015/0115418 A1 * | 4/2015 | Wei | H01L 21/3086 257/639 |
| 2016/0035571 A1 * | 2/2016 | Chang | H01L 21/0338 438/703 |
| 2016/0247766 A1 * | 8/2016 | Conklin | H01L 23/544 |

FOREIGN PATENT DOCUMENTS

| | | |
|---|---|---|
| TW | 200713496 A | 4/2007 |
| TW | 200729415 A | 8/2007 |
| TW | 200830358 A | 7/2008 |
| TW | 201037820 A | 10/2010 |
| TW | 201129882 A | 9/2011 |
| TW | 201338039 A | 9/2013 |
| TW | 201417140 A | 5/2014 |
| TW | 201435977 A | 9/2014 |

\* cited by examiner

SEMICONDUCTOR DEVICES INCLUDING ACTIVE PATTERNS HAVING DIFFERENT PITCHES AND METHODS OF FABRICATING THE SAME

CROSS-REFERENCE TO RELATED APPLICATION

This application claims priority to and benefit of Korean Patent Application No. 10-2015-0009822, filed on Jan. 21, 2015, with the Korean Intellectual Property Office, the disclosure of which is hereby incorporated herein by reference as if set forth in its entirety.

FIELD

The present inventive concept generally relates to semiconductor devices and, more particularly, to highly integrated semiconductor devices and methods of fabricating the same.

BACKGROUND

As the degree of integration of semiconductor devices increase, design limitations related to the components of semiconductor devices have decreased. Patterns having a micro line width, beyond a resolution limit value of a photolithography device may be required to be formed in manufacturing micropatterned semiconductor devices having a high degree of integration. Moreover, technology allowing for the formation of patterns having identical micro line widths and different pitches with respect to each other, using a simplified process featuring a reduced number of applications of a photolithography process and a mask layer forming process may be required. Furthermore, a semiconductor device having such active patterns with a micro line width may also be required.

SUMMARY

Some embodiments of the present inventive concept provide methods of manufacturing a semiconductor device allowing for the formation of active patterns having substantially identical micro line widths and various pitches with respect to each other, using a simplified process, and a semiconductor device manufactured using the same.

Further embodiments of the inventive concept provide methods of manufacturing a semiconductor device including sequentially stacking hardmask layers, a first sacrificial layer, and a second sacrificial layer on a substrate, forming first mandrels on the first sacrificial layer by etching the second sacrificial layer, forming first spacers on side walls of the first mandrels, forming a photoresist pattern disposed outside a region from which the first mandrels have been removed, spaced apart from the first spacers, and having a line width greater than a line width of the first spacer, forming second mandrels and a third mandrel by etching the first sacrificial layer using the first spacers and the photoresist pattern as respective etching masks, forming second spacers on side walls of the second mandrels and forming third spacers on side walls of the third mandrel, forming first active patterns having a first pitch and second active patterns having a second pitch greater than the first pitch, by etching the hardmask layer and at least a portion of the substrate using the second and third spacers as respective etching masks, and forming a device isolation layer so that upper portions of the first active patterns and the second active patterns are protruded.

In still further embodiments, the first pitch may range from 30 nm to 35 nm, and the second pitch may range from 40 nm to 50 nm.

In some embodiments, the method may further include removing the second mandrels and the third mandrel after the second spacers and the third spacers are formed, such that the second spacers and the third spacers having different pitches may be retained in linear form.

In further embodiments, pitches of the second spacers may be determined by a line width of the first spacer, and pitches of the third spacers may be determined by a line width of the photoresist pattern.

In still further embodiments, the pitches of the third spacers may be greater than the pitches of the second spacers.

In some embodiments, the forming of the first spacers on side walls of the first mandrels may include forming a first spacer material layer conformally covering the first mandrels, and etching back the first spacer material layer.

In further embodiments, the forming of the second spacers and the third spacers on side walls of the second mandrels and the third mandrel may include forming a second spacer material layer conformally covering the second mandrels and the third mandrel, and etching back the second spacer material layer.

In still further embodiments, the first sacrificial layer and the second sacrificial layer may include any one of polycrystalline silicon, amorphous silicon, and spin on hardmask (SOH).

In some embodiments, the hardmask layers may include at least one of polycrystalline silicon, silicon oxide, and silicon nitride.

Further embodiments of the present inventive concept provide methods of manufacturing a semiconductor device including sequentially stacking hardmask layers, a first sacrificial layer, and a second sacrificial layer on a substrate, forming first mandrels by etching the second sacrificial layer using a first photoresist pattern formed on the second sacrificial layer as an etching mask, forming first spacers on side walls of the first mandrel, forming a second photoresist pattern disposed in a region from which the first mandrels has been removed, spaced apart from the first spacers, and having a line width greater than a line width of the first spacer, forming second mandrels and a third mandrel having different line widths by etching the first sacrificial layer using the first spacers and the second photoresist pattern as respective etching masks, forming second spacers on side walls of the second mandrels and forming third spacers on side walls of the third mandrel, forming a hardmask pattern by etching the hardmask layer using the second spacers and the third spacers having different pitches as an etching mask, forming first active patterns having a first pitch and second active patterns having a second pitch greater than the first pitch, by etching the substrate using the hardmask pattern as an etching mask, and forming a device isolation layer so that upper portions of the first active patterns and the second active patterns are protruded.

In still further embodiments, the first pitch may range from 30 nm to 35 nm, and the second pitch may range from 40 nm to 50 nm.

In some embodiments, distances between the second photoresist pattern and the first spacers adjacent to the second photoresist may be substantially the same as each other.

In further embodiments, a line width of the third mandrel may be greater than a line width of the second mandrels.

In still further embodiments, the method of manufacturing a semiconductor device may further include removing the second mandrels and the third mandrel after the second spacers and the third spacers are formed, such that the second spacers and the third spacers having different pitches may be retained in linear form.

In some embodiments, pitches of the second spacers may be determined by a line width of the first spacer, and pitches of the third spacers may be determined by a line width of the second photoresist pattern.

In further embodiments, pitches of the third spacers may be greater than pitches of the second spacers.

Still further embodiments of the present inventive concept provide methods of manufacturing a semiconductor device including sequentially stacking hardmask layers, a first sacrificial layer, and a second sacrificial layer on a substrate having a first region and a second region, forming a first photoresist pattern on the second sacrificial layer in the first region, forming first mandrels on the first sacrificial layer in the first region by etching the second sacrificial layer using the first photoresist pattern as an etching mask, forming first spacers on side walls of the first mandrels in the first region, forming a second photoresist pattern on the first sacrificial layer in the first region, to be spaced apart from the first spacers and disposed outside a region from which the first mandrels have been removed and forming a third photoresist pattern and a forth photoresist pattern having different line widths on the first sacrificial layer in the second region, forming second mandrels and a third mandrel in the first region by etching the first sacrificial layer using the first spacer and the second photoresist pattern as respective etching masks and forming a forth mandrel and a fifth mandrel in the second region by etching the first sacrificial layer using the third photoresist pattern and the fourth photoresist pattern as respective etching masks, forming second to fifth spacers on side walls of the second to fifth mandrels, forming first active patterns having a first pitch in the first region, second active patterns having a second pitch greater than the first pitch in the first region, third active patterns having a third pitch in the second region, and fourth active patterns having a fourth pitch greater than the third pitch in the second region, by etching the hardmask layer and at least a portion of the substrate using the second to fifth spacers as respective etching masks, and forming a device isolation layer so that upper portions of the first to fourth active patterns may be protruded. Here, a line width of each of the second to fourth photoresist patterns may be larger than a line width of the first spacer, and a line width of the fourth photoresist pattern may be larger than a line width of each of the second and third photoresist patterns.

In some embodiments, a distance between the second photoresist pattern and the first spacer disposed adjacent to the second photoresist pattern may be smaller than a distance between the third photoresist pattern and the fourth photoresist pattern.

In further embodiments, in the forming of the first mandrels, the second sacrificial layer may be entirely removed from the second region.

In still further embodiments, the method of manufacturing a semiconductor device may further include removing the second to fifth mandrels after the second to fifth spacers are formed, such that second spacers and third spacers having different pitches may be retained in linear form in the first region, and fourth spacers and fifth spacers having different pitches may be retained in linear form in the second region.

In some embodiments, pitches of the second spacers may be determined by a line width of the first spacer, and pitches of the third to fifth spacers may be respectively determined by line widths of the second to fourth photoresist patterns.

In further embodiments, the first region may be a logic region, and the second region may be a static random access memory (SRAM) region.

Still further embodiments of the present inventive concept provide a semiconductor device including a substrate, a device isolation layer disposed on the substrate, and first and second active patterns protruding above the device isolation layer and having identical line widths and different pitches. Here, the first active patterns may be disposed to have a first pitch ranging from 30 nm to 35 nm, and the second active patterns may be disposed to have a second pitch greater than the first pitch.

In some embodiments, the second pitch may range from 40 nm to 50 nm.

In further embodiments, the first active patterns and the second active patterns may be disposed adjacent to each other, and a distance between the first active pattern and the second active pattern adjacent to the first active pattern may be substantially the same as a distance between the first active patterns.

In still further embodiments, the first active patterns and the second active patterns may be disposed adjacent to each other, and a distance between the first active pattern and the second active pattern adjacent to the first active pattern may be greater than a distance between the first active patterns.

In some embodiments, the first active patterns may be formed using quadruple patterning technology (QPT), and the second active patterns may be formed using double patterning technology (DPT).

In further embodiments, the semiconductor device may further include a gate electrode disposed to cover and cross the active patterns protruding above the device isolation layer, gate spacers disposed on both side walls of the gate electrode, a gate insulation layer disposed between the gate electrode and the active patterns and between the gate electrode and the gate spacers, and a source/drain region formed in the active patterns, on both sides of the gate electrode.

In still further embodiments, the gate electrode may include at least one work function-controlling film and at least one gate metal.

In some embodiments, the gate insulation layer may include an insulation material having a dielectric constant higher than a dielectric constant of silicon oxide film.

BRIEF DESCRIPTION OF DRAWINGS

The above and other aspects, features and advantages of the present inventive concept will be more clearly understood from the following detailed description taken in conjunction with the accompanying drawings, in which.

DETAILED DESCRIPTION

Figure 1:
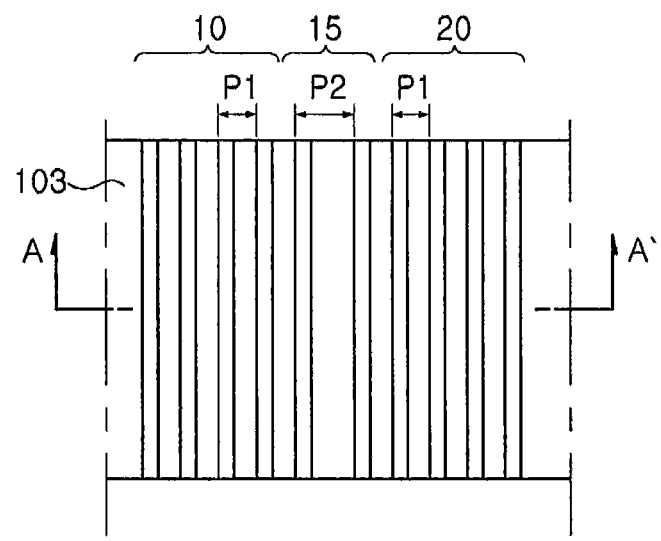
FIG. 1 is a plan view illustrating a pattern of a semiconductor device manufactured using methods according to some embodiments of the present inventive concept.

Advantages and features of the present inventive concept and methods of accomplishing the same may be understood more readily by reference to the following detailed description of embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Referring first to FIG. 1, a plan view illustrating a pattern of a semiconductor device manufactured using a method of manufacturing a semiconductor device according to some embodiments of the present inventive concept will be discussed. As illustrated in FIG. 1, active patterns 10, 15, and 20 having identical line widths and different pitches may be formed in linear form on a substrate. A device isolation layer 103 may fill areas between the active patterns 10, 15, and 20. The device isolation layer 103 may fill the areas between the active patterns 10, 15, and 20 to a predetermined height, and upper portions of the active patterns 10, 15, and 20 may protrude above the device isolation layer 103. Line widths of the active patterns 10, 15, and 20 may be the same as a resolution limit value of a commercialized photolithography device or less. The active pattern may include first active patterns 10 and 20 having a first pitch P1, and second active patterns 15 having a second pitch P2 and disposed adjacent to the first active patterns 10 and 20. The second pitch P2 may be greater than the first pitch P1. The first pitch P1 may range from 30 nm to 35 nm. The second pitch P2 may range from 40 nm to 50 nm. The first active patterns 10 and 20 may be formed using quadruple patterning technology (QPT), and the second active patterns 15 may be formed using double patterning technology (DPT).

FIGS. 2A through 2J are cross-sections illustrating processing steps in the fabrication of semiconductor devices according to some embodiments of the present inventive concept. FIGS. 2A through 2J are views illustrating the semiconductor device taken along line A-A' of FIG. 1.

Figure 2A:
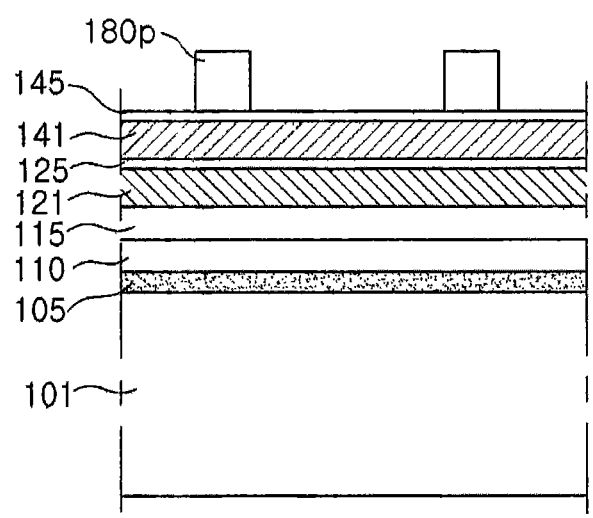
FIGS. 2A through 2J are cross-sections illustrating processing steps in the fabrication of semiconductor devices according to some embodiments of the present inventive concept.

Referring first to FIG. 2A, a first hardmask layer 105, a second hardmask layer 110, a third hardmask layer 115, a first sacrificial layer 121, a first anti-reflection layer 125, a second sacrificial layer 141, and a second anti-reflection layer 145 may be sequentially formed on a substrate 101.

The substrate 101 may be a semiconductor substrate such as a silicon wafer. In some embodiments, the substrate 101 may be a silicon on insulator (SOI) substrate.

The first to third hardmask layers 105, 110, and 115 may be formed of at least one of a silicon-containing material such as, for example, silicon oxide ($SiO_x$), silicon oxynitride (SiON), silicon nitride ($Si_xN_y$), tetraethylorthosilicate (TEOS), polycrystalline silicon, and the like, a carbon-containing material such as a material of an amorphous carbon layer (ACL) and a material of a spin-on hardmask (SOH), or a metal. For example, the first hardmask layer 105 may be formed of a silicon nitride, and a silicon oxide having a reduced thickness may be included in a lower portion of the silicon nitride. The second hardmask layer 110 may be formed of a silicon oxide. The third hardmask layer 115 may be formed of polycrystalline silicon.

Figure 2B:
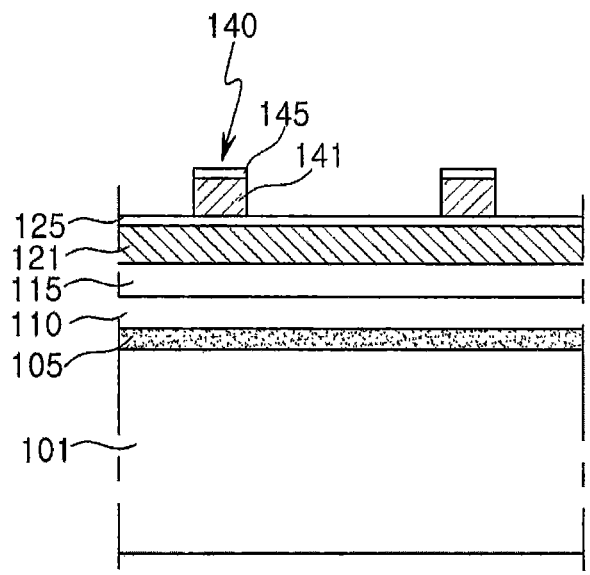
Figure 2C:
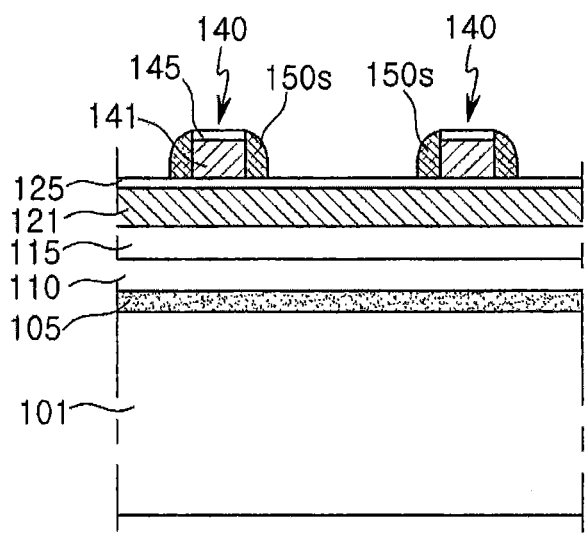
Figure 2D:
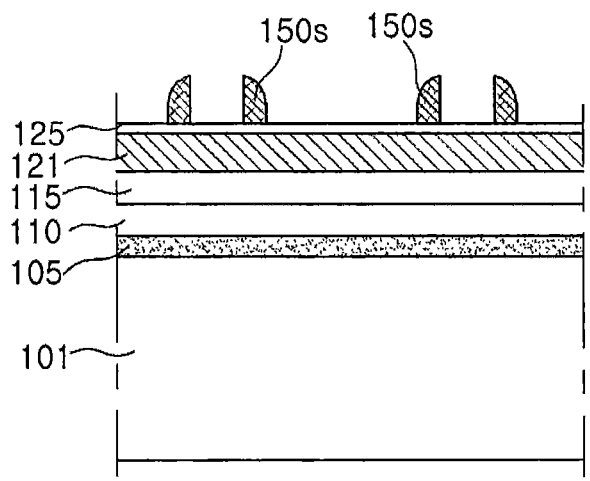
Figure 2E:
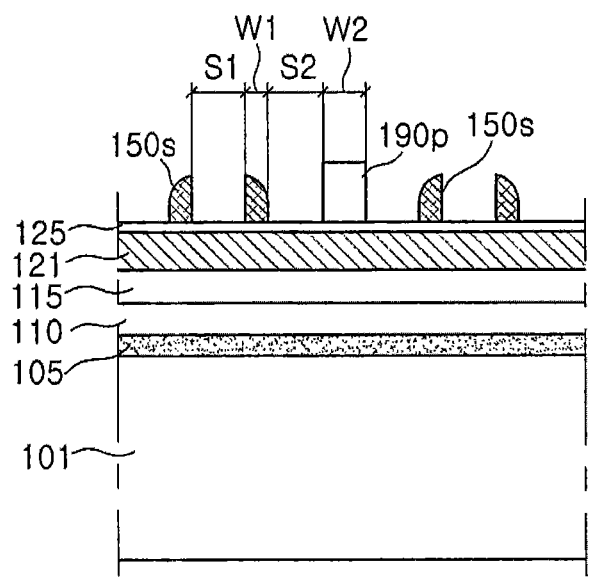
Figure 2F:
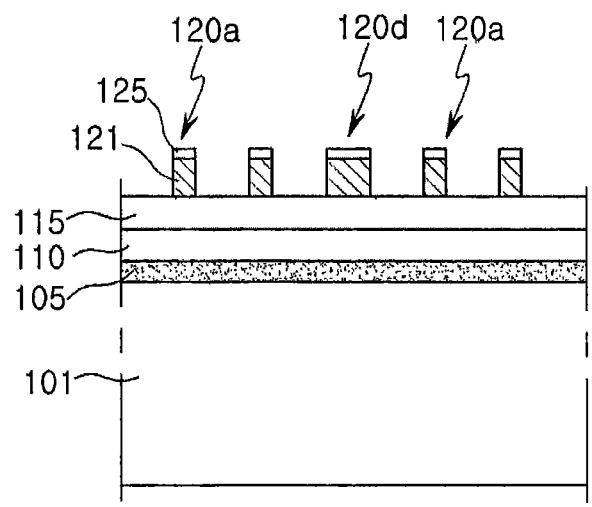
Figure 2G:
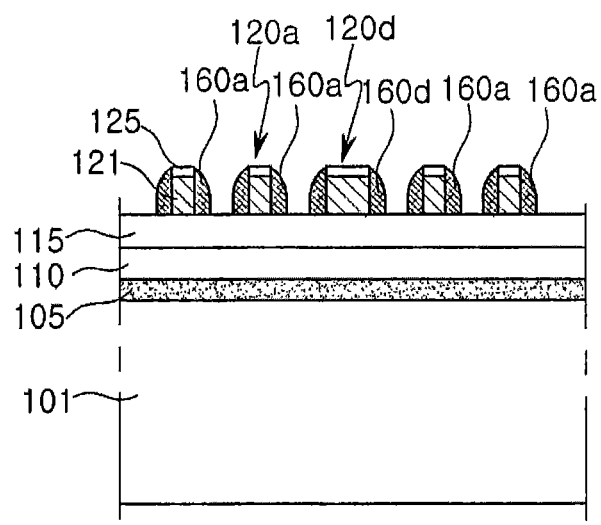

The first sacrificial layer 121 and the second sacrificial layer 141 may be layers for formation of first spacers 150s, second spacers 160a, and a third spacer 160d in a subsequent process (see FIG. 2C and FIG. 2G). The first sacrificial layer 121 and the second sacrificial layer 141 may contain at least one of polycrystalline silicon, amorphous carbon layer (ACL), and spin-on hardmask (SOH).

The first anti-reflection layer 125 may be a layer formed to reduce, or possibly prevent, light reflection occurring due to an underlayer of the first sacrificial layer 121, and the second anti-reflection layer 145 may be a layer formed to reduce, or possibly prevent, light reflection occurring due to an underlayer of the second sacrificial layer 141, during a photolithography process. The first anti-reflection layer 125 and the second anti-reflection layer 145 may be configured of a silicon oxynitride film.

The first to third hardmask layers 105, 110, and 115, the first and second sacrificial layers 121 and 141, the first and second anti-reflection layers 125 and 145 may be formed using a process such as atomic layer deposition (ALD), chemical vapor deposition (CVD), spin coating, and the like, and a baking process or a hardening process may be further performed depending on the material forming the layers.

The first photoresist patterns 180p may be formed in a linear form by performing a photolithography process after the second sacrificial layer 141 is covered with a photoresist film.

Referring now to FIG. 2B, first mandrels 140 may be formed in a linear form on the first sacrificial layer 121 by anisotropically etching the second anti-reflection layer 145 and the second sacrificial layer 141 using the first photoresist patterns 180p as an etching mask.

Referring now to FIG. 2C, the first spacers 150s may be formed on side walls of the first mandrels 140. In particular, the first spacers 150s may be formed on the side walls of the first mandrels 140 by performing an etch-back process after forming a first spacer material layer conformally covering the first mandrels 140. A thickness of the first spacer material layer may be determined in consideration of a distance between first active patterns 10 and 20 (see FIG. 1) to be finally formed. The distance between the first active patterns 10 and 20 to be finally formed may be smaller than a resolution limit value of a commercialized photolithography device.

The first spacer material layer may be formed of a material having etch selectivity with respect to the first mandrels 140. For example, when the first mandrels 140 are formed of any one of polycrystalline silicon, amorphous carbon layer (ACL), and spin-on hardmask (SOH), the first spacer material layer may be formed of silicon oxide or silicon nitride. The first spacer material layer may be formed using an atomic layer deposition (ALD) process.

Referring now to FIG. 2D, by removing the first mandrels 140 in a selective manner, the first spacers 150s may be retained in linear form on the first sacrificial layer 121. Since the first spacers 150s may have etch selectivity with respect to the first mandrels 140 under a specific etching condition, the first mandrels 140 may be removed in a selective manner.

Referring now to FIG. 2E, a second photoresist pattern 190p may be formed on the first sacrificial layer 121, to be spaced apart from the first spacers 150s and disposed outside a region from which the first mandrels 140 have been removed.

A line width W2 of the second photoresist pattern 190p may be greater than a line width W1 of the first spacers 150s. The line width W2 of the second photoresist pattern 190p may be determined in consideration of a distance between second active patterns 15 (see FIG. 1) to be finally formed.

A distance between two most adjacent first spacers 150s may be substantially identical to a line width of the first mandrel 140. A distance S2 between a first spacer 150s and the second photoresist pattern 190p may be substantially identical to a distance S1 between two most adjacent first spacers 150s. According to some embodiments of the present inventive concept, the line width W2 of the second photoresist pattern 190p may be reduced, and the distance S2 between a first spacer 150s and the second photoresist pattern 190p may be greater than the distance S1 between two most adjacent first spacers 150s. Since the line width W2 of the second photoresist pattern 190p may serve to determine a pitch P2 of the second active patterns 15, the pitch P2 of the second active patterns 15 may be freely changed by adjusting the line width W2 of the second photoresist pattern 190p.

Referring now to FIG. 2F, second mandrels 120a and a third mandrel 120d may be formed on the third hardmask layer 115. The second mandrels 120a and the third mandrel 120d may be formed on the third hardmask layer 115 by etching the first anti-reflection layer 125 and the first sacrificial layer 121 using the first spacers 150s and the second photoresist pattern 190p as respective etching masks.

The second mandrels 120a are formed in positions corresponding to positions of the first spacers 150s, and the third mandrel 120d may be formed in a position corresponding to a position of the second photoresist pattern 190p.

Referring now to FIG. 2G, second spacers 160a and third spacers 160d may be formed on side walls of the second mandrels 120a and the third mandrel 120d.

In particular, the second spacers 160a may be formed on the side walls of the second mandrels 120a, and the third spacers 160d may be formed on the side walls of the third mandrel 120d, by performing an etch-back process after forming a second spacer material layer conformally covering the second mandrels 120a and the third mandrel 120d. A thickness of the second spacer material layer may be determined in consideration of a line width of active patterns to be finally formed. The line width of active patterns to be finally formed may be less than a resolution limit value of a commercialized photolithography device.

The second spacer material layer may be formed of a material having etch selectivity with respect to the second mandrels 120a and the third mandrel 120d. For example, when the second mandrels 120a and the third mandrel 120d are formed of any one of polycrystalline silicon, an amorphous carbon layer (ACL), and spin-on hardmask (SOH), the second spacer material layer may be formed of silicon oxide or silicon nitride. The second spacer material layer may be formed using an atomic layer deposition (ALD) process.

Figure 2H:
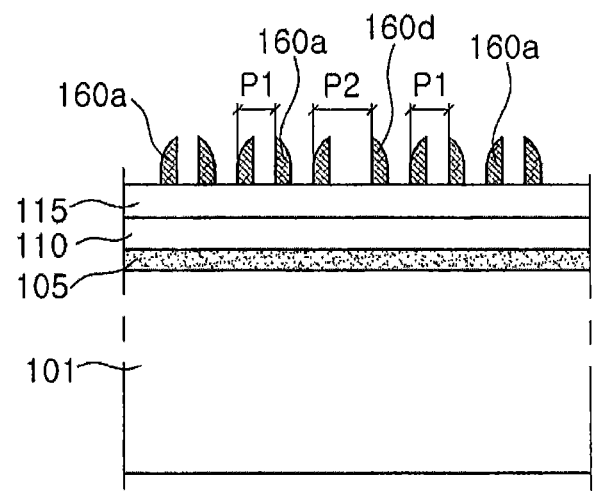

Referring now to FIG. 2H, the second spacers 160a and the third spacers 160d may be retained in a linear form on the third hardmask layer 115 by removing the second mandrels 120a and the third mandrel 120d in a selective manner. Since the second spacers 160a and the third spacers 160d have etch selectivity with respect to the second mandrels 120a and the third mandrel 120d under a specific etching condition, the second mandrels 120a and the third mandrel 120d may be removed in a selective manner.

In particular, the second spacers 160a may be retained in linear form by removing the second mandrels 120a, and the third spacers 160d may be retained in linear form by removing the third mandrel 120d.

The second spacers 160a and the third spacers 160d may have different pitches. A pitch P2 of the third spacers 160d may be greater than a pitch P1 of the second spacers 160a.

The pitch P1 of the second spacers 160a may be determined by a line width of the first spacer 150s, and the pitch P2 of the third spacers 160d may be determined by a line width of the second photoresist pattern 190p.

Figure 2I:
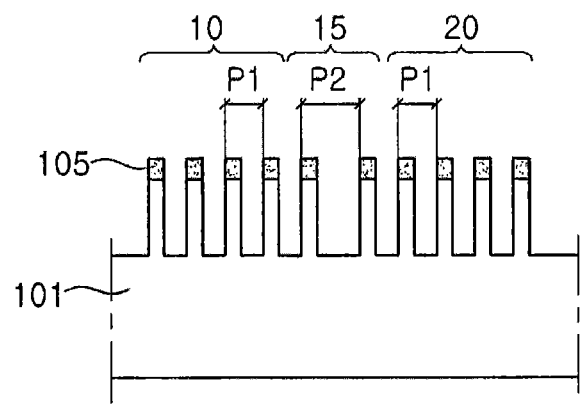

Referring now to FIG. 2I, the first active patterns 10 and 20 and the second active patterns 15 having different pitches may be formed on the substrate 101 by anisotropically etching the first to third hardmask layers 105, 110, and 115 and at least a portion of the substrate 101 using the second spacers 160 A and the third spacers 160d as respective etching masks.

The first active patterns 10 and 20 may be formed as the second spacers 160a are transferred to the substrate 101, and the second active patterns 15 may be formed as the third spacers 160d are transferred to the substrate 101, by a process in which the substrate 101 is anisotropically etched.

First, hardmask patterns having different pitches may be formed by etching hardmask layers using the second spacers 160a and the third spacers 160d having different pitches as an etching mask. The first active patterns 10 and 20 having a first pitch and the second active patterns 15 having a second pitch greater than the first pitch may be formed by anisotropically etching the substrate 101 using the hardmask patterns as an etching mask. After the substrate 101 is anisotropically etched, the first hardmask layer 105 may be retained on upper portions of the active patterns 10, 15, and 20.

The first pitch may range from 30 nm to 35 nm, and the second pitch may range from 40 nm to 50 nm.

Figure 2J:
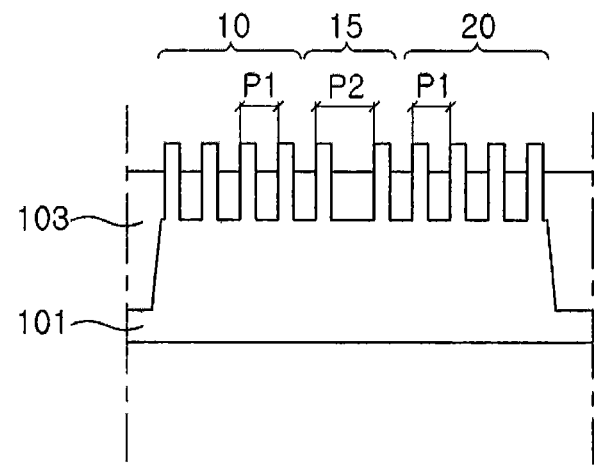

Referring now to FIG. 2J, a device isolation layer 103 may be formed so that upper portions of the first active patterns 10 and 20 and the second active patterns 15 may be protruded.

First, an insulation layer may be formed to fill a shallow trench between the active patterns formed as the substrate 101 is anisotropically etched, and then a preliminary device isolation layer may be formed by performing a planarization process so that the first hardmask layer 105 may be exposed.

Next, an additional deep trench may be formed, and then an insulation layer may be formed to fill the deep trench. Next, a device isolation layer 103 may be formed by performing a planarization process so that the first hardmask layer 105 may be exposed. However, it will be understood that embodiments of the present inventive concept are not limited to this configuration. For example, a deep trench may not be formed, depending on example embodiments of the present inventive concept.

The insulation layer may be formed using any one of, for example, boron-phosphor silicate glass (BPSG), high density plasma (HDP)oxide, flowable oxide (FOX), tonen siliazene (TOSZ), spin on glass (SOG), undoped silica glass (USG), tetraethyl orthosilicate (TEOS), and low temperature oxide (LTO). The planarization process may be performed using a chemical mechanical polishing (CMP) process.

The first hardmask layer 105 retained in upper portions of the first active patterns 10 and 20 and the second active patterns 15 may be removed in a selective manner, and the device isolation layer 103 may be etched by a predetermined depth so that upper portions of the first active patterns 10 and 20 and the second active patterns 15 may be protruded. In these embodiments, upper surfaces and portions of both side surfaces of the first active patterns 10 and 20 and the second active patterns 15 may be exposed.

In some embodiments of the present inventive concept, referring to FIG. 2A to FIG. 2J, the first active patterns 10 and 20 may be formed to have a pitch ranging from 30 nm to 35 nm using quadruple patterning technology, and the second active patterns 15 may be formed to have a pitch greater than the pitch of the first active patterns 10 and 20 using double patterning technology. A pitch of the second active patterns 15 may range from 40 nm to 50 nm.

As discussed above, active patterns having identical line widths and different pitches may be easily formed in a semiconductor device using both the quadruple patterning technology and the double patterning technology. On the other hand, in a case in which only the quadruple patterning technology is used, two pairs of active patterns always having a same pitch may be formed from a single photoresist pattern. Thus, active patterns having different pitches may not be formed only with the quadruple patterning technology.

Figure 3:
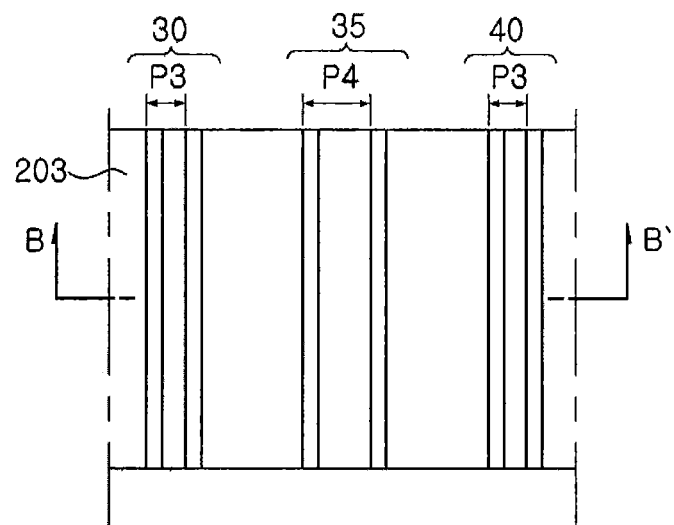
FIG. 3 is a plan view illustrating a pattern of a semiconductor device manufactured using methods according to some embodiments of the present inventive concept.

Referring now to FIG. 3, a plan view illustrating a pattern of a semiconductor device according to some embodiments of the present inventive concept will be discussed. As illustrated in FIG. 3, active patterns 30, 35, and 40 having identical line widths and different pitches may be formed in linear form on a substrate. Line widths of the active patterns 30, 35, and 40 may be the same as a resolution limit value of a commercialized photolithography device or less. The active pattern may include first active patterns 30 and 40 having a first pitch P3, and second active patterns 35 having a second pitch P4 and disposed adjacent to the first active patterns 30 and 40. The second pitch P4 may be greater than the first pitch P3. The first pitch P3 may range from 30 nm to 35 mm. The second pitch P4 may range from 40 nm to 50 nm. The first active patterns 30 and 40 may be formed using quadruple patterning technology, and the second active patterns 35 may be formed using double patterning technology.

A device isolation layer 203 may fill areas between the active patterns 30, 35, and 40. The device isolation layer 203 may fill the areas between the active patterns 30, 35, and 40 to a predetermined height, and upper portions of the active patterns 30, 35, and 40 may protrude above the device isolation layer 203.

FIGS. 4A through 4J are cross-sections illustrating processing steps in the fabrication of semiconductor devices in accordance with embodiments of the present inventive concept. The semiconductor device taken along line B-B' of FIG. 3 is illustrated in FIGS. 4A through 4J.

Figure 4A:
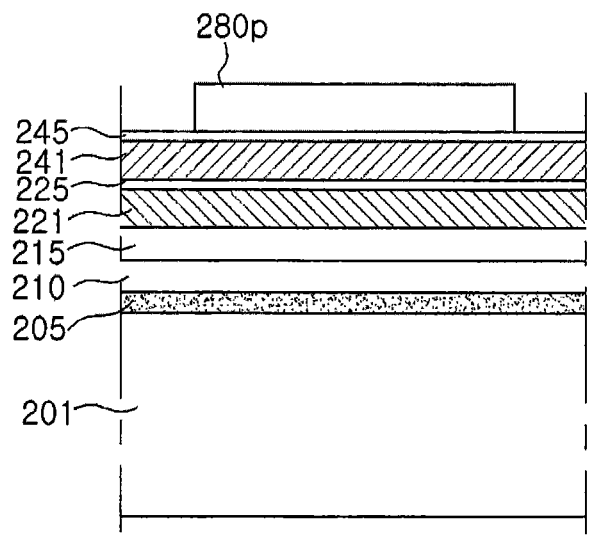
FIGS. 4A through 4J are cross-sections illustrating processing steps in the fabrication of semiconductor devices according to some embodiments of the present inventive concept.

Referring now to FIG. 4A, a first hardmask layer 205, a second hardmask layer 210, a third hardmask layer 215, a first sacrificial layer 221, a first anti-reflection layer 225, a second sacrificial layer 241, and a second anti-reflection layer 245 may be sequentially formed on a substrate 201.

The substrate 201 may be a semiconductor substrate such as a silicon wafer. In some embodiments, the substrate 201 may be a silicon on insulator (SOI) substrate.

The first to third hardmask layers 205, 210, and 215 may be formed using at least one of a silicon-containing material such as, for example, silicon oxide ($SiO_x$), silicon oxynitride (SiON), silicon nitride ($Si_xN_y$), tetraethyl orthosilicate (TEOS), polycrystalline silicon, and the like, a carbon-containing material such as a material of amorphous carbon layer (ACL) and a material of spin-on hardmask (SOH), or a metal. For example, the first hardmask layer 205 may be formed of a silicon nitride, and a silicon oxide having a reduced thickness may be further included in a lower portion of the silicon nitride. The second hardmask layer 210 may be formed of silicon oxide. The third hardmask layer 215 may be formed of polycrystalline silicon.

Figure 4B:
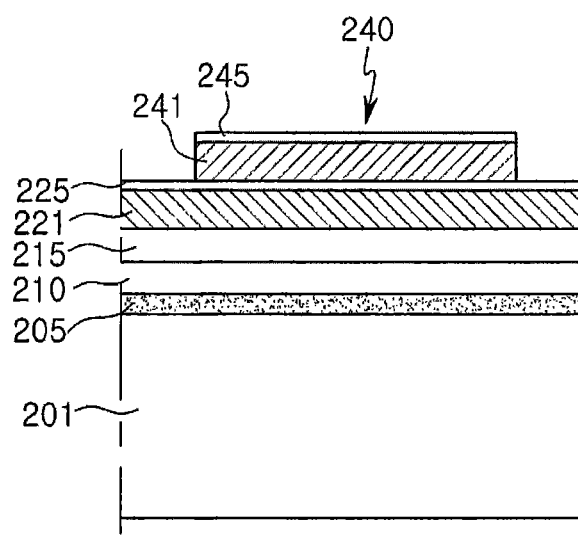
Figure 4C:
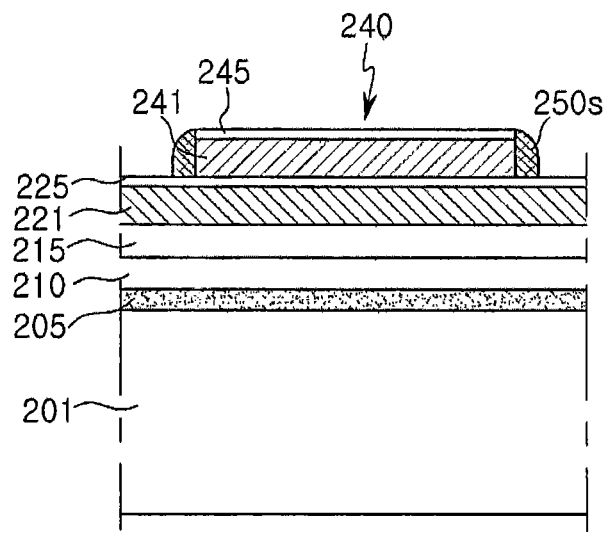
Figure 4D:
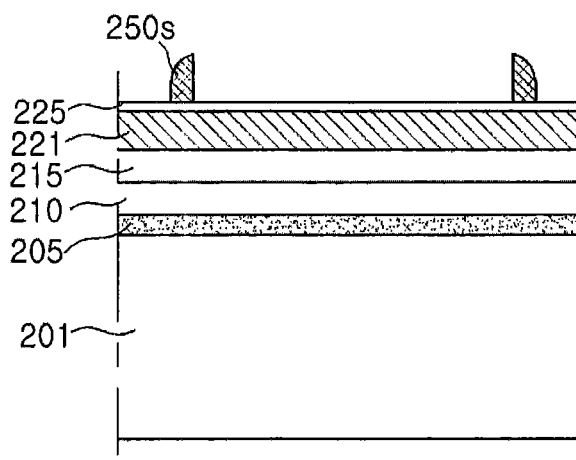
Figure 4E:
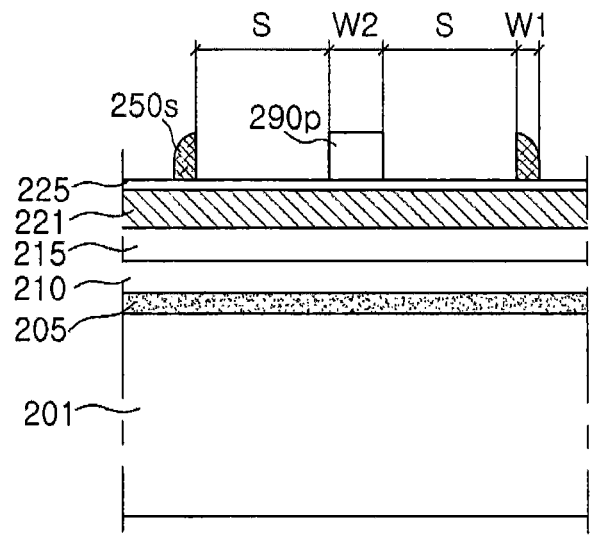
Figure 4F:
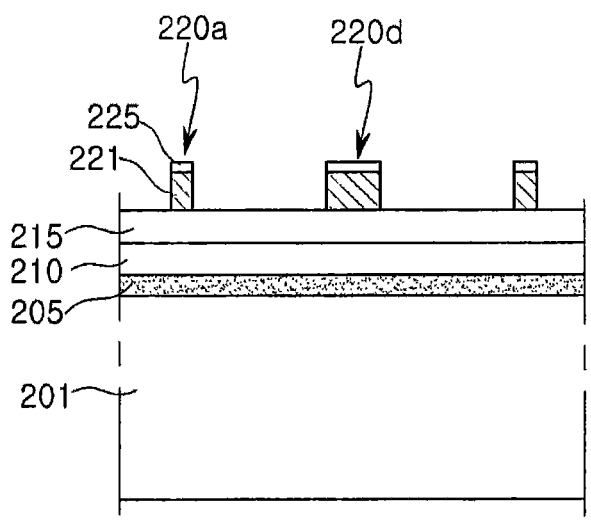
Figure 4G:
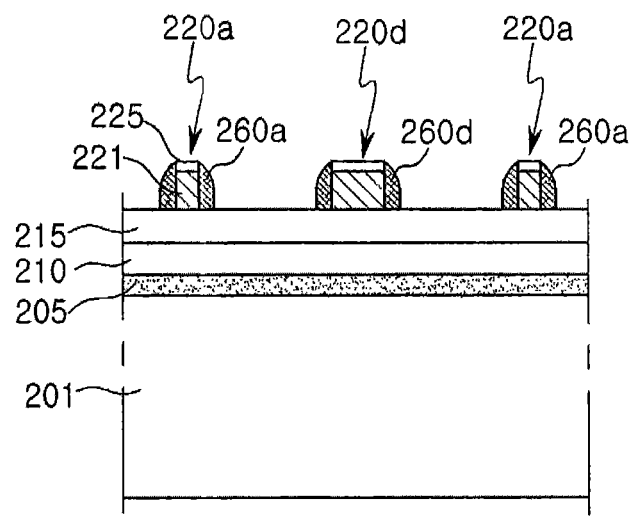

The first sacrificial layer 221 and the second sacrificial layer 241 may be layers for formation of first spacers 250s, second spacers 260a, and third spacers 260d during a subsequent process (see FIG. 4C and FIG. 4G). The first sacrificial layer 221 and the second sacrificial layer 241 may contain at least one of polycrystalline silicon, amorphous carbon layer (ACL), and spin-on hardmask (SOH).

The first anti-reflection layer 225 may be a layer formed to prevent light reflection occurring due to an underlayer of the first sacrificial layer 221, and the second anti-reflection layer 245 may be a layer formed to prevent light reflection occurring due to an underlayer of the second sacrificial layer 241, during a photolithography process. The first anti-reflection layer 225 and the second anti-reflection layer 245 may be configured of a silicon oxynitride film (SiON).

The first to third hardmask layers 205, 210, and 215, the first and second sacrificial layers 221 and 241, and the first and second anti-reflection layers 225 and 245 may be formed using a process such as atomic layer deposition (ALD), chemical vapor deposition (CVD), spin coating, and the like, and a baking process or a hardening process may be further performed depending on a material forming the layers.

A photoresist film may be covered on the second sacrificial layer 241, and first photoresist patterns 280p may be formed in linear form through a photolithography process.

Referring now to FIG. 4B, first mandrels 240 may be formed on the first sacrificial layer 221 by anisotropically etching the second anti-reflection layer 245 and the second sacrificial layer 241 using the first photoresist patterns 280p as an etching mask.

Referring now to FIG. 4C, the first spacers 250s may be formed on side walls of the first mandrels 240. In particular, the first spacers 250s may be formed on the side walls of the first mandrels 240 by performing an etch-back process after forming a first spacer material layer conformally covering the first mandrels 240. A thickness of the first spacer material layer may be determined in consideration of a distance between first active patterns 30 and 40 (see FIG. 1) to be finally formed. The distance between the first active patterns 30 and 40 to be finally formed may be smaller than a resolution limit value of a commercialized photolithography device.

The first spacer material layer may be formed of a material having etch selectivity with respect to the first mandrels 240. For example, when the first mandrels 140 are formed of any one of, for example, polycrystalline silicon, amorphous carbon layer (ACL), and spin-on hardmask (SOH), the first spacer material layer may be formed of silicon oxide or silicon nitride. The first spacer material layer may be formed using an atomic layer deposition (ALD) process.

Referring now to FIG. 4D, the first spacers 250s may be retained in linear form on the first sacrificial layer 221 by removing the first mandrels 240 in a selective manner. Since the first spacers 250s may have etch selectivity with respect to the first mandrels 240 under a specific etching condition, the first mandrels 240 may be removed in a selective manner.

Referring now to FIG. 4E, a second photoresist pattern 290p may be formed on the first sacrificial layer 221 to be spaced apart from the first spacers 250s and disposed in a region from which the first mandrels 240 have been removed.

A line width W2 of the second photoresist pattern 290p may be greater than a line width W1 of the first spacers 250s. The line width W2 of the second photoresist pattern 290p may be determined in consideration of a distance between second active patterns 35 (see FIG. 1) to be finally formed.

Distances S between the second photoresist pattern 290p and the first spacers 250s adjacent to the second photoresist pattern 290p and may be substantially identical to each other.

According to some embodiments of the present inventive concept, the line width W2 of the second photoresist pattern 290p may be decreased or increased. Since the line width W2 of the second photoresist pattern 290p may serve to determine a pitch P2 of the second active patterns 35, the pitch P2 of the second active patterns 35 may be freely changed by adjusting the line width W2 of the second photoresist pattern 290p.

Referring now to FIG. 4F, second mandrels 220a and a third mandrel 220d may be formed on the third hardmask layer 215. The second mandrels 220a and the third mandrel 220d may be formed on the third hardmask layer 215 by etching the first anti-reflection layer 225 and the first sacrificial layer 221 using the first spacers 250s and the second photoresist pattern 290p as respective etching masks.

The second mandrels 220a may be formed in positions corresponding to positions of the first spacers 250s, and the third mandrel 220d may be formed in a position corresponding to a position of the second photoresist pattern 290p.

Referring now to FIG. 4G, second spacers 260a may be formed on side walls of the second mandrels 220a, and third spacers 260d may be formed on side walls of the third mandrel 220d.

In particular, the second spacers 260a may be formed on the side walls of the second mandrels 220a, and the third spacers 260d may be formed on the side walls of the third mandrels 220d, by performing an etch-back process after forming a second spacer material layer conformally covering the second mandrels 220a and the third mandrel 220d. A thickness of the second spacer material layer may be determined in consideration of a line width of active patterns to be finally formed. The line width of active patterns to be finally formed may be smaller than a resolution limit value of a commercialized photolithography device.

The second spacer material layer may be formed of a material having etch selectivity with respect to the second mandrels 220a and the third mandrel 220d. For example, when the second mandrels 220a and the third mandrel 220d are formed of any one of polycrystalline silicon, amorphous carbon layer (ACL), and spin-on hardmask (SOH), the second spacer material layer may be formed of silicon oxide or silicon nitride. The second spacer material layer may be formed using an atomic layer deposition (ALD) process.

Figure 4H:
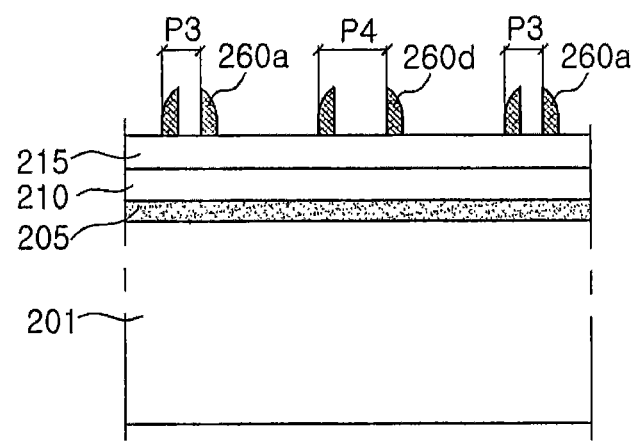

Referring now to FIG. 4H, the second spacers 260a and the third spacers 260d may be retained in linear form on the third hardmask layer 215 by removing the second mandrels 220a and the third mandrel 220d in a selective manner. Since the second spacers 260a and the third spacers 260d have etch selectivity with respect to the second mandrels 220a and the third mandrel 220d under a specific etching condition, the second mandrels 220a and the third mandrel 220d may be removed in a selective manner.

The second spacers 260a may be retained in linear form by removing the second mandrels 220a, and the third spacers 260d may be formed in linear form by removing the third mandrel 220d.

The second spacers 260a and the third spacers 260d may have different pitches. A pitch P4 of the third spacers 260d may be greater than a pitch P3 of the second spacers 260a.

The pitch P3 of the second spacers 260a may be determined by a line width of the first spacer 250s, and the pitch P4 of the third spacers 260d may be determined by a line width of the second photoresist pattern 290p.

Figure 4I:
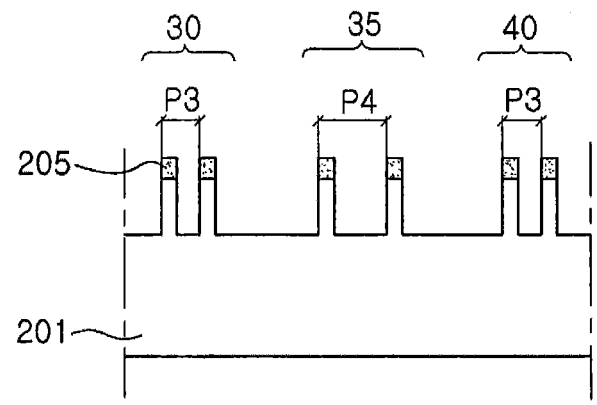

Referring to FIG. 4I, the first active patterns 30 and 40 and the second active patterns 35 having different pitches may be formed on the substrate 201 by anisotropically etching the first to third hardmask layers 205, 210, and 215 and at least a portion of the substrate 201 using the second spacers 260a and the third spacers 260d as respective etching masks. The first active patterns 30 and 40 may be formed as the second spacers 260a are transferred to the substrate 201, and the second active patterns 35 may be formed as the third spacers 260d are transferred to the substrate 201, by a process in which the substrate 201 is anisotropically etched.

First, hardmask patterns having different pitches may be formed by etching hardmask layers using the second spacers 260a and the third spacers 260d having different pitches as an etching mask. Next, the first active patterns 30 and 40 having a third pitch and the second active patterns 35 having a fourth pitch greater than the third pitch may be formed by anisotropically etching the substrate 201 using the hardmask patterns as an etching mask. After the substrate 201 is anisotropically etched, the first hardmask layer 205 may be retained in upper portions of the active patterns 10, 15, and 20.

The third pitch may range from 30 nm to 35 nm, and the fourth pitch may range from 40 nm to 50 nm.

Figure 4J:
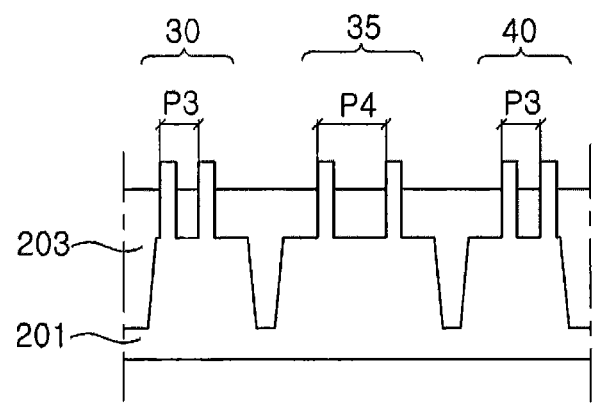

Referring now to FIG. 4J, a device isolation layer 203 may be formed so that upper portions of the first active patterns 30 and 40 and the second active patterns 35 may be protruded.

First, an insulation layer may be formed to fill a shallow trench between the active patterns formed as the substrate 201 is anisotropically etched, and a preliminary device isolation layer may be formed by performing a planarization process so that the first hardmask layer 205 may be exposed.

An additional deep trench may be formed, and then an insulation layer may be formed to fill the deep trench. A device isolation layer 203 may be formed by performing a planarization process so that the first hardmask layer 205 may be exposed. However, it will be understood that embodiments of the present inventive concept are not limited to this configuration. For example, in some embodiments a deep trench may not be formed.

The insulation layer may be formed using any one of, for example, boron-phosphor silicate glass (BPSG), high density plasma (HDP) oxide, flowable oxide (FOX), tonen siliazene (TOSZ), spin on glass (SOG), undoped silica glass (USG), tetraethyl orthosilicate (TEOS), and low temperature oxide (LTO). The planarization process may be performed using a chemical mechanical polishing (CMP) process.

The first hardmask layer 205 retained in upper portions of the first active patterns 30 and 40 and the second active patterns 35 may be removed in a selective manner, and the device isolation layer 203 may be etched by a predetermined depth so that upper portions of the first active patterns 30 and 40 and the second active patterns 35 may be protruded. In these embodiments, upper surfaces and portions of both side surfaces of the first active patterns 30 and 40 and the second active patterns 35 may be exposed.

According to some embodiments of the present inventive concept, referring to FIG. 4A to FIG. 4J, the first active patterns 30 and 40 may be formed to have a pitch ranging from 30 nm to 40 nm using quadruple patterning technology, and the second active patterns 35 may be formed to have a pitch greater than the pitch of the first active patterns 30 and 40 using double patterning technology (DPT). For example, a pitch of the second active patterns 35 may range from 40 nm to 50 nm.

As discussed above, active patterns having identical line widths and different pitches may be easily formed in a semiconductor device using both the quadruple patterning technology and the double patterning technology. On the other hand, in a case in which only the quadruple patterning technology is used, two pairs of active patterns always having a same pitch may be formed from a single photoresist pattern. Thus, active patterns having different pitches may not be formed only with the quadruple patterning technology.

Figure 5:
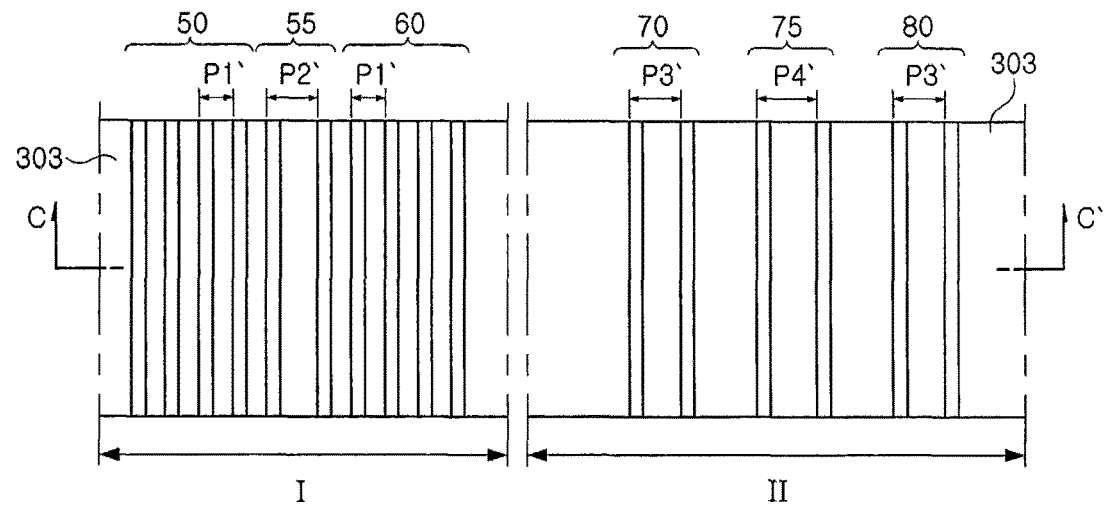
FIG. 5 is a plan view illustrating a pattern of a semiconductor device manufactured using methods according to some embodiments of the present inventive concept.

FIG. 5 is a plan view illustrating a pattern of a semiconductor device according to some embodiments of the present inventive concept. As illustrated in FIG. 5, the semiconductor device may include a first region I and a second region II. For example, in FIG. 5, the first region I may be a logic region, and the second region II may be a static random access memory (SRAM) region.

Referring to FIG. 5, active patterns 50, 55, and 60 having identical line widths and different pitches may be formed in linear form on a substrate 301 in the first region I. Line widths of the active patterns 50, 55, and 60 may be the same as a resolution limit value of a commercialized photolithography device or less. The first region I may include first active patterns 50 and 60 having a first pitch P1' and second active patterns 55 having a second pitch P2' and disposed adjacent to the first active patterns 50 and 60. The second pitch P2' may be greater than the first pitch P1'. The first pitch P1' may range from 30 nm to 35 nm. The second pitch P2' may range from 40 nm to 50 nm. The first active patterns 50 and 60 may be formed using quadruple patterning technology (QPT), and the second active patterns 55 may be formed using double patterning technology (DPT).

A device isolation layer 303 may be formed in areas between the active patterns 50, 55, and 60. The device isolation layer 303 may fill the areas between the active patterns 50, 55, and 60 to a predetermined height, and upper portions of the active patterns 50, 55, and 60 may protrude above the device isolation layer 303.

As illustrated in FIG. 5, active patterns 70, 75, and 80 having identical line widths and different pitches may be formed in linear form on a substrate 301 in the second region II. Line widths of the active patterns 70, 75, and 80 may be the same as a resolution limit value of a commercialized photolithography device or less. The second region II may include first active patterns 70 and 80 having a third pitch P3', and second active patterns 75 having a fourth pitch P4' and disposed adjacent to the first active patterns 70 and 80. The fourth pitch P4' may be greater than the third pitch P3'. The active patterns 70, 75, and 80 in the second region II may be formed using a double patterning technology.

A device isolation layer 303 may be formed in areas between the active patterns 70, 75, and 80. The device isolation layer 303 may fill the areas between the active patterns 70, 75, and 80 to a predetermined height, and upper portions of the active patterns 70, 75, and 80 may protrude above the device isolation layer 303.

FIGS. 6A through 6J are cross-sections illustrating processing steps in the fabrication of semiconductor device according to some embodiments of the present inventive concept. The semiconductor device taken along line C-C' of FIG. 5 is illustrated in FIGS. 6A through 6J.

Figure 6A:
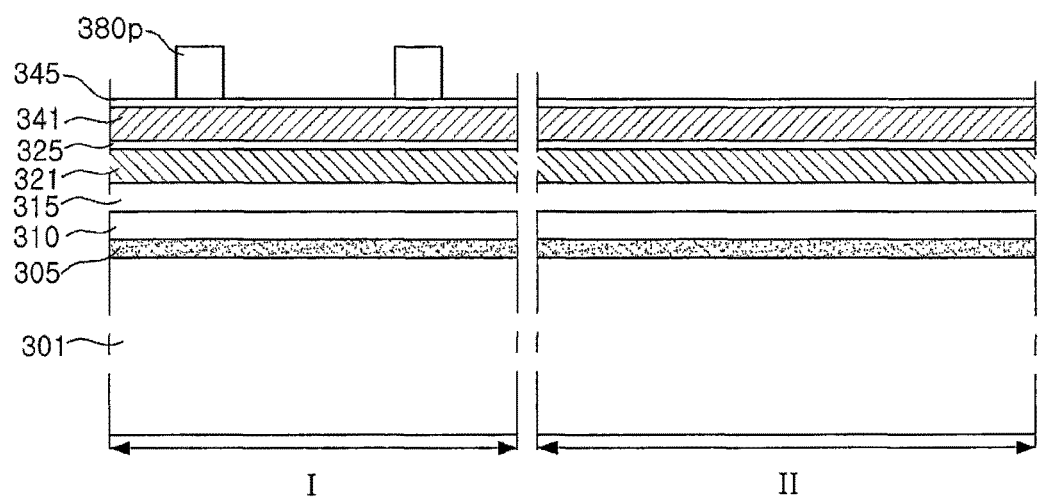
FIGS. 6A through 6J are cross-sections illustrating processing steps in the fabrication of semiconductor devices according to some embodiments of the present inventive concept.

Referring now to FIG. 6A, a first hardmask layer 305, a second hardmask layer 310, a third hardmask layer 315, a first sacrificial layer 321, a first anti-reflection layer 325, a second sacrificial layer 341, and a second anti-reflection layer 345 may be sequentially formed on a substrate 301.

The substrate 301 may be a semiconductor substrate such as a silicon wafer. In some embodiments, the substrate 301 may be a silicon on insulator (SOI) substrate.

The first to third hardmask layers 305, 310, and 315 may be formed using at least one of a silicon-containing material such as, for example, silicon oxide ($SiO_x$), silicon oxynitride (SiON), tetraethyl orthosilicate (TEOS), polycrystalline silicon ($Si_xN_y$), and the like, a carbon-containing material such as a material of an amorphous carbon layer (ACL) and a material of spin-on hardmask (SOH), or a metal. For example, the first hardmask layer 305 may be formed of silicon nitride, and silicon oxide having a reduced thickness may be further included in a lower portion of the silicon nitride. For example, the second hardmask layer 310 may be formed of silicon oxide. For example, the third hardmask layer 315 may be formed of polycrystalline silicon.

Figure 6B:
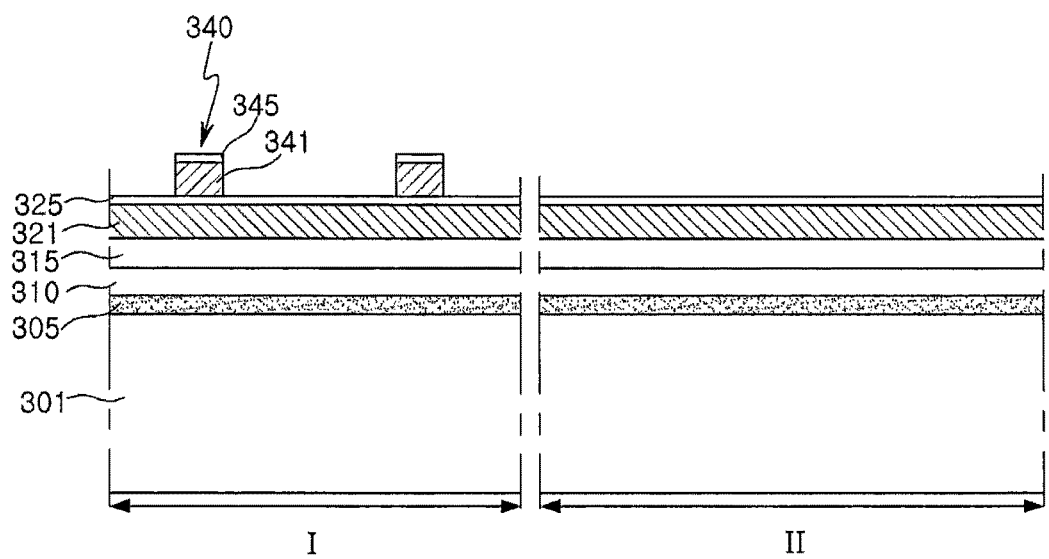
Figure 6C:
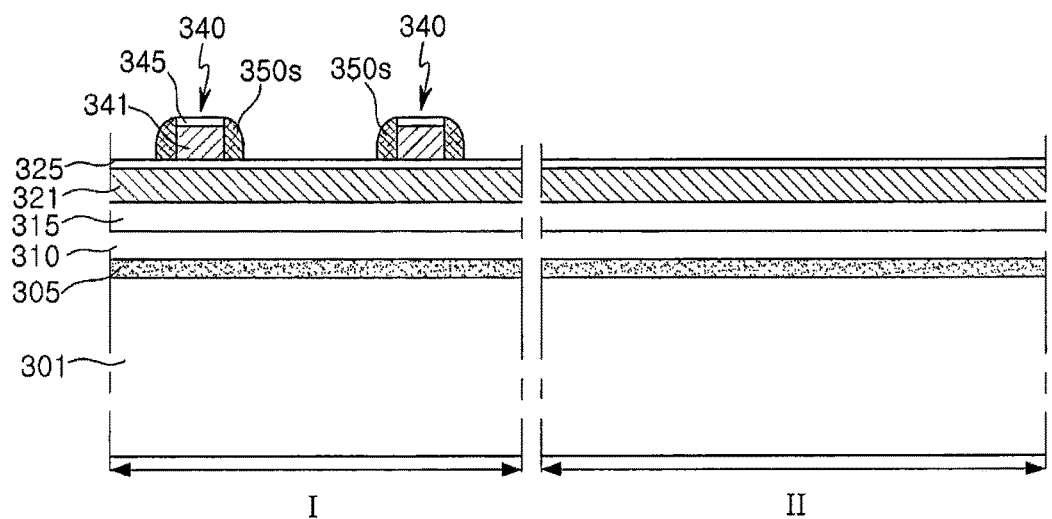
Figure 6D:
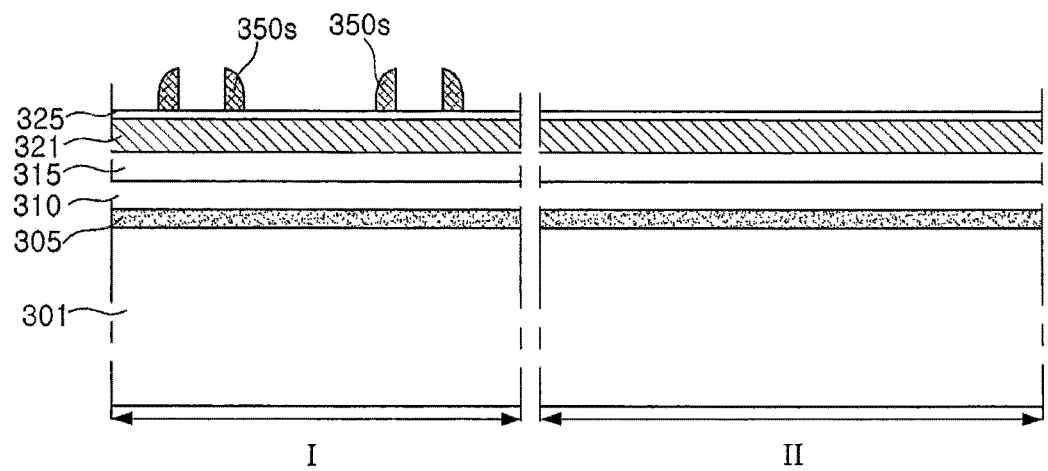
Figure 6E:
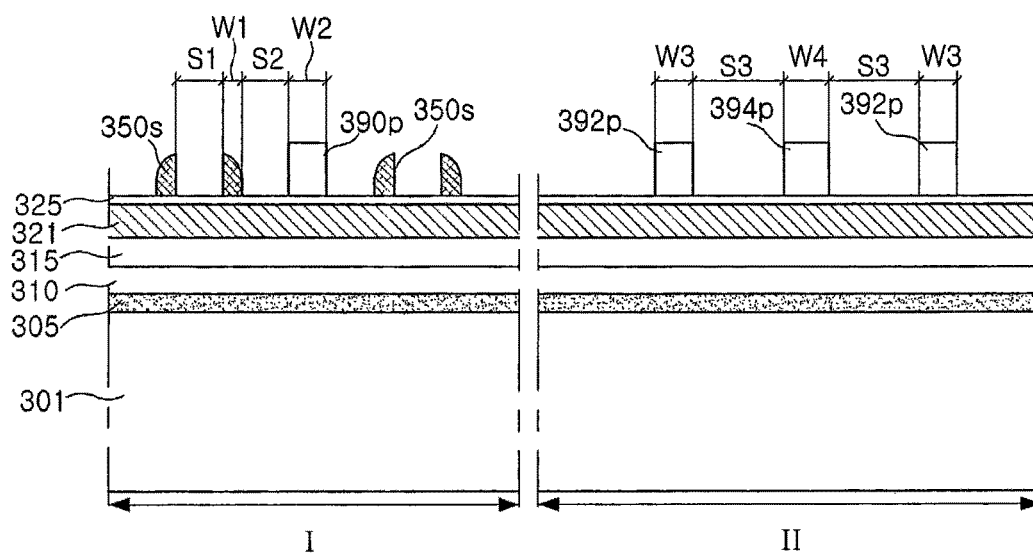
Figure 6F:
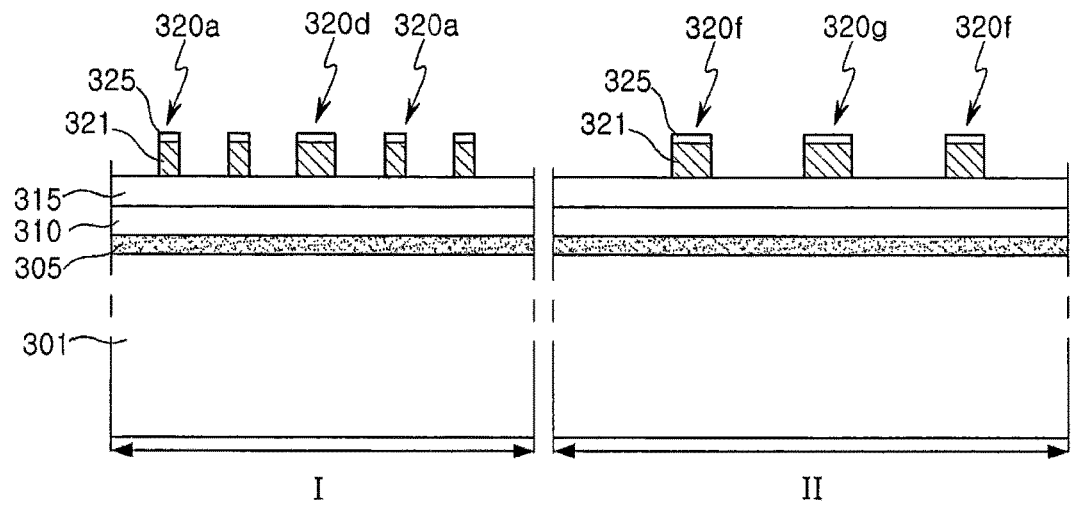
Figure 6G:
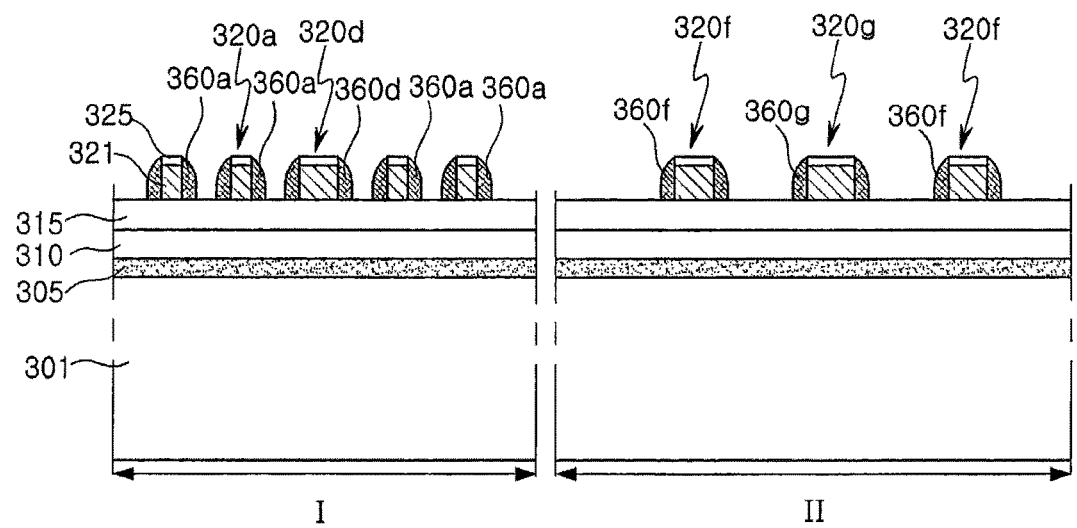

The first sacrificial layer 321 may be a layer for a formation of first spacers 350s during a subsequent process (see FIG. 6C), and the second sacrificial layer 341 may be a layer for a formation of second spacers 360a, third spacers 360d, fourth spacers 360f, and fifth spacers 360g (see FIG. 6G).

The first sacrificial layer 321 and the second sacrificial layer 341 may contain any one of polycrystalline silicon, amorphous carbon (ACL), and spin-on hardmask (SOH).

The first anti-reflection layer 325 may be a layer formed to reduce, or possibly prevent, light reflection occurring due to an underlayer of the first sacrificial layer 321, and the second anti-reflection layer 345 may be a layer formed to reduce, or possibly prevent, light reflection occurring due to an underlayer of the second sacrificial layer 341, during a photolithography process. The first anti-reflection layer 325 and the second anti-reflection layer 345 may be formed of a silicon oxynitride film (SiON).

The first to third hardmask layers 305, 310, and 315, the first and second sacrificial layers 321 and 341, and the first and second anti-reflection layers 325 and 345 may be formed using a process such as atomic layer deposition (ALD), chemical vapor deposition (CVD), spin coating, or the like, and a baking process or a hardening process may be further performed depending on a material forming the layers.

A photoresist film may be covered on the second sacrificial layer 341, and first photoresist patterns 380p may be formed in linear form through a photolithography process.

Referring now to FIG. 6B, first mandrels 340 may be formed in linear form on the first sacrificial layer 321 in the first region I by anisotropically etching the second anti-reflection layer 345 and the second sacrificial layer 341 using the first photoresist patterns 380p as an etching mask. In these embodiments, the second anti-reflection layer 345 and the second sacrificial layer 341 may be entirely removed from the second region II through an etching process.

Referring now to FIG. 6C, the first spacers 350s may be formed on side walls of the first mandrels 340 in the first region I. In particular, the first spacers 350s may be formed on the side walls of the first mandrels 340 by performing an etch-back process after forming a first spacer material layer conformally covering the first mandrels 340. A thickness of the first spacer material layer may be determined in consideration of a distance between active patterns to be finally formed. The distance between the active patterns to be finally formed may be smaller than a resolution limit value of a commercialized photolithography device.

The first spacer material layer may be formed of a material having etch selectivity with respect to the first mandrels 340. For example, when the first mandrels 340 are formed of any one of polycrystalline silicon, amorphous carbon layer (ACL), and spin-on hardmask (SOH), the first spacer material layer may be formed of silicon oxide or silicon nitride. The first spacer material layer may be formed using an atomic layer deposition (ALD) process.

Referring now to FIG. 6D, in the first region I, the first spacers 350s may be formed in linear form on the first sacrificial layer 321 by removing the first mandrels 340 in a selective manner. Since the first spacers 350s may be formed of a material having etch selectivity with respect to the first mandrels 340 under a specific etching condition, the first mandrels 340 may be removed in the selective manner.

Referring now to FIG. 6E, in the first region I, a second photoresist pattern 390p may be formed on the first sacrificial layer 321 to be spaced apart from the first spacers 350s and disposed outside a region from which the first mandrels 340 have been removed. In the second region II, a third photoresist pattern 392p and a fourth photoresist pattern 394p having different line widths may be formed on the first sacrificial layer 321.

Line widths W2, W3, and W4 of the second to the fourth photoresist patterns 390p, 392p, and 394p may be greater than a line width W1 of the first spacers 350s. The line width W4 of the fourth photoresist pattern 394p may be greater than the line widths W2 and W3 of the second and third photoresist patterns 390p and 392p.

A distance S1 between two most adjacent spacers 350s may be substantially identical to a line width of the first mandrel 340. A distance S2 between the second photoresist pattern 390p and the first spacer 350s disposed most adjacent to the second photoresist pattern 390p may be substantially identical to the distance S1 between two most adjacent first spacers 350s. According to some embodiments of the present inventive concept, a line width W2 of the second photoresist pattern 390p may be reduced, and the distance S2 between the second photoresist pattern 390p and a first spacer 350s disposed most adjacent to the second photoresist pattern 390p may be greater than the distance S1 between two most adjacent spacers 350s. Since the line width W2 of the second photoresist pattern 390p may serve to determine a pitch P2' of the second active patterns 55, the pitch P2' of the second active patterns 55 may be freely changed by adjusting the line width W2 of the second photoresist pattern 390p.

Furthermore, a distance S3 between the third photoresist patterns 392p and the fourth photoresist pattern 394p may be greater than the distance S2 between the second photoresist pattern 390p and a first spacer 350s disposed most adjacent to the second photoresist pattern 390p.

Referring now to FIG. 6F, second mandrels 320a and a third mandrel 320d may be formed on the third hardmask layer 315 in the first region I, and fourth mandrels 320f and a fifth mandrel 320g may be formed on the third hardmask layer 315 in the second region II.

In the first region I, the second mandrels 320a and the third mandrel 320d may be formed on the third hardmask layer 315 by etching the first anti-reflection layer 325 and the first sacrificial layer 321 using the first spacers 350s and the second photoresist pattern 390p as respective etching masks. In the second region II, the fourth mandrels 320f and the fifth mandrel 320g may be formed on the third hardmask layer 315 by etching the first anti-reflection layer 325 and the first sacrificial layer 321 using the third photoresist patterns 392p and the fourth photoresist pattern 394p as respective etching masks.

The second mandrels 320a may be formed in positions corresponding to positions of the first spacers 350s, and the third mandrel 320d may be formed in a position corresponding to a position of the second photoresist pattern 390p. The fourth mandrels 320f may be formed in positions corresponding to positions of the third photoresist patterns 392p, and the fifth mandrel 320g may be formed in a position corresponding to a position of the fourth photoresist pattern 394p.

Referring now to FIG. 6G, second to fifth spacers 360a, 360d, 360f, and 360g may be formed on the side walls of the second to fifth mandrels 320a, 320d, 320f, and 320g, respectively.

In particular, the second to fifth spacers 360a, 360d, 360f, and 360g may be formed on the side walls of the second to fifth mandrels 320a, 320d, 320f, and 320g by performing an etch-back process after forming a second spacer material layer conformally covering the second to fifth mandrels 320a, 320d, 320f, and 320g. A thickness of the second spacer material layer may be determined in consideration of a line width of active patterns to be finally formed. The line width of active patterns to be finally formed may be smaller than a resolution limit value of a commercialized photolithography device.

The second spacer material layer may be formed of a material having etch selectivity with respect to the second to fifth mandrels 320a, 320d, 320f, and 320g. For example, when the second to fifth mandrels 320a, 320d, 320f, and 320g are formed of any one of polycrystalline silicon, amorphous carbon layer (ACL), and spin-on hardmask (SOH), the second spacer material layer may be formed of silicon oxide or silicon nitride. The second spacer material layer may be formed using an atomic layer deposition (ALD) process.

Figure 6H:
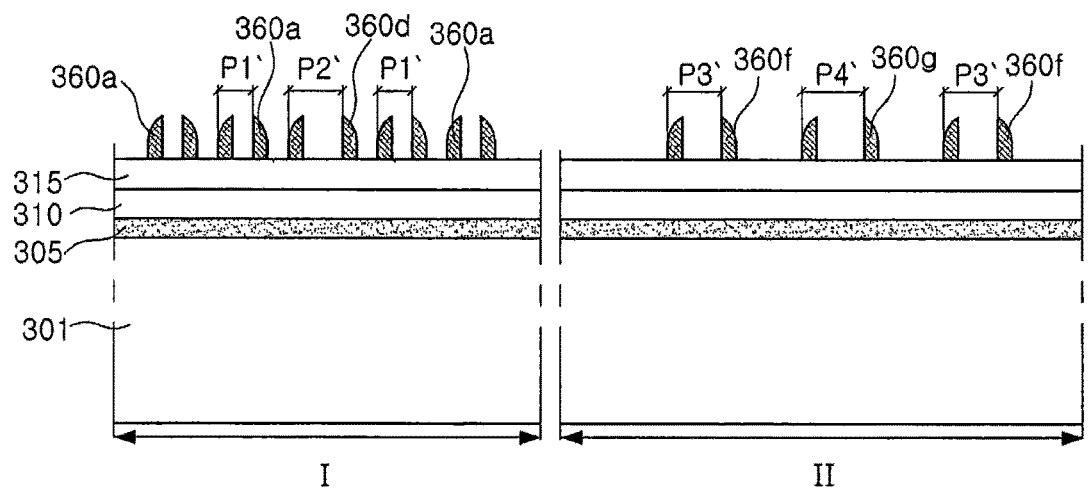

Referring now to FIG. 6H, the second spacers 360a and the third spacers 360d may be retained in linear form on the third hardmask layer 315 in the first region I, and the fourth spacers 360f and the fifth spacers 360g may be retained on the third hardmask layer 315 in the second region II, by removing the second to fifth mandrels 320a, 320d, 320f, and 320g in a selective manner. Since the second to fifth spacers 360a, 360d, 360f, and 360g have etch selectivity with respect to the second to fifth mandrels 320a, 320d, 320f, and 320g under a specific etching condition, the second to fifth mandrels 320a, 320d, 320f, and 320g may be removed in a selective manner.

The second spacers 360a, the third spacers 360d, the fourth spacers 360f, and the fifth spacers 360g may have different pitches. The second spacers 360a and the third spacers 360d having different pitches may be retained in linear form on the third hardmask layer 315 in the first region I by removing the second mandrels 320a and the third mandrel 320d from the first region I, and the fourth spacers 360f and the fifth spacers 360g having different pitches may be retained in linear form on the third hardmask layer 315 in the second region II by removing the fourth mandrels 360f and the fifth mandrel 360g from the second region II.

A pitch P1' of the second spacers 360a may be smaller than a pitch P2' of the third spacers 360d, and a pitch P3' of the fourth spacers 360f may be smaller than a pitch P4' of the fifth spacers 360g. The pitch P1' of the second spacers 360a may be the smallest thereamong, and the pitch P4' of the fifth spacers 360g may be the largest thereamong.

The pitch P1' of the second spacers 360a may be determined by a line width of the first spacer 350s, and the pitch P2' of the third spacers 360d may be determined by a line width of the second photoresist pattern 390p. The pitch P3' of the fourth spacers 360f may be determined by a line width of the third photoresist pattern 392p, and the pitch P4' of the fifth spacers 360g may be determined by a line width of the fourth photoresist pattern 394p.

Figure 6I:
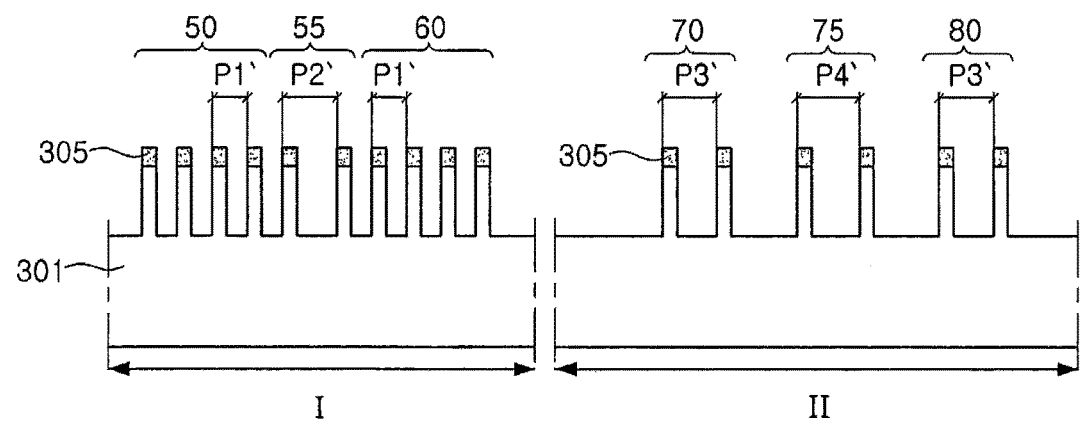

Referring now to FIG. 6I, active patterns 50, 55, 60, 70, 75, and 80 having different pitches may be formed on the substrate 301 by anisotropically etching the first to third hardmask layers 305, 310, and 315 and at least a portion of the substrate 301 using the second to fifth spacers 360a, 360d, 360f, and 360g as respective etching masks.

In the first region I, the first active patterns 50 and 60 may be formed as the second spacers 360a are transferred to the substrate 301, and the second active patterns 55 may be formed as the third spacers 360d are transferred to the substrate 301, during a process in which the substrate 301 is anisotropically etched. In addition, in the second region II, the third active patterns 70 and 80 may be formed as the fourth spacers 360f are transferred to the substrate 301, and the fourth active patterns 75 may be formed as the fifth spacers 360g are transferred to the substrate 301, during a process in which the substrate 301 is anisotropically etched.

First, hardmask patterns having different pitches may be formed in the first region I and the second region II by etching hardmask layers using the second to fifth spacers 360a, 360d, 360f, and 360g having different pitches as respective etching masks. Next, in the first region I, the first active patterns 50 and 60 having a first pitch P1' and the second active patterns 55 having a second pitch P2' greater than the first pitch P1' may be formed by anisotropically etching the substrate 301 using the hardmask patterns as an etching mask. In the second region II, the third active patterns 70 and 80 having a third pitch P3' and the fourth active patterns 75 having a fourth pitch P4' greater than the third pitch P3' may be formed by anisotropically etching the substrate 301 using the hardmask patterns as an etching mask. After the substrate 301 is anisotropically etched, the first hardmask layer 305 may be left in upper portions of the active patterns 50, 55, 60, 70, 75, and 80.

The first pitch P1' may be smaller than the second pitch P2'. The third pitch P3' may be smaller than the fourth pitch P4'. The first pitch P1' may be the smallest thereamong, and the fourth pitch P4' may be the greatest thereamong.

The first pitch P1' may range from 30 nm to 35 nm, and the second pitch P2' may range from 40 nm to 50 nm.

Figure 6J:
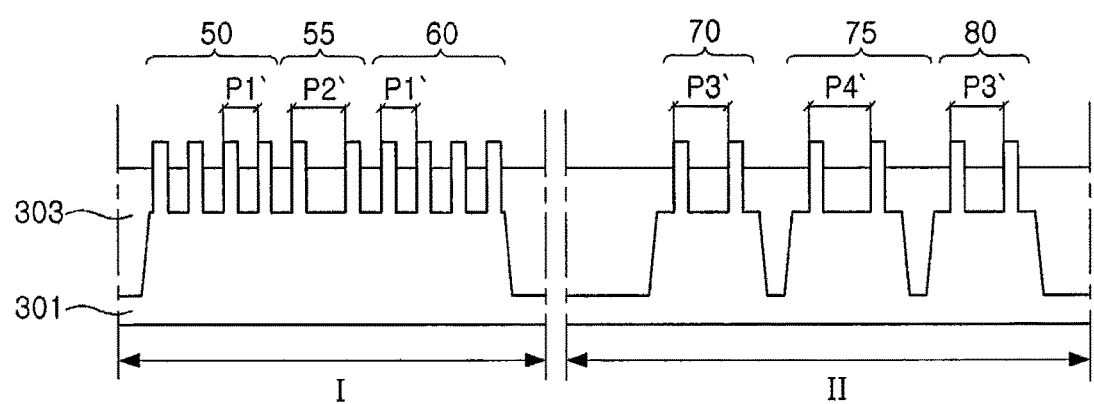

Referring now to FIG. 6J, a device isolation layer 303 may be formed so that upper portions of the first active patterns 50 and 60, the second active patterns 55, the third active patterns 70 and 80, and the fourth active patterns 75 are protruded.

First, an insulation layer may be formed to fill a shallow trench between the active patterns formed as the substrate 301 is anisotropically etched, and then a preliminary device isolation layer may be formed by performing a planarization process so that the first hardmask layer 305 is exposed.

A deep trench may be additionally formed, and then an insulation layer may be formed to fill the deep trench. The device isolation layer 303 may be formed by performing a planarization process so that the first hardmask layer 305 may be exposed. However, it will be understood that embodiments of the present inventive concept are not limited to this configuration. For example, a deep trench may not be formed without departing from the scope of the present inventive concept.

The insulation layer may be formed of any one of boron-phosphor silicate glass (BPSG), high density plasma (HDP) oxide, flowable oxide (FOX), tonen siliazene (TOSZ), spin on glass (SOG), undoped silica glass (USG), tetraethyl orthosilicate (TEOS), and low temperature oxide (LTO). The planarization process may be performed using a chemical mechanical polishing (CMP) process.

The first hardmask layer 305 left in upper portions of the first to fourth active patterns 50, 55, 60, 70, 75, and 80 may be removed in a selective manner, and then the device isolation layer 303 may be etched by a predetermined depth so that upper portions of the first to fourth active patterns 50, 55, 60, 70, 75, and 80 are protruded. In these embodiments, upper surfaces and portions of both side surfaces of the first to fourth active patterns 50, 55, 60, 70, 75, and 80 may be exposed.

As discussed above, active patterns having identical line widths and different pitches may be easily formed in a plurality of regions in a semiconductor device using both the quadruple patterning technology and the double patterning technology.

The second region II may be a flash memory cell area, unlike in FIG. 5 and FIGS. 6A to 6J. In these embodiments active patterns having identical pitches and disposed repeatedly are required in the second region II. Active patterns having identical pitches and disposed repeatedly in the second region II may be obtained by forming photoresist patterns having an identical line width and disposed at regular intervals as described in FIG. 6E and performing subsequent processes with reference to FIG. 6F to FIG. 6J.

Figure 7:
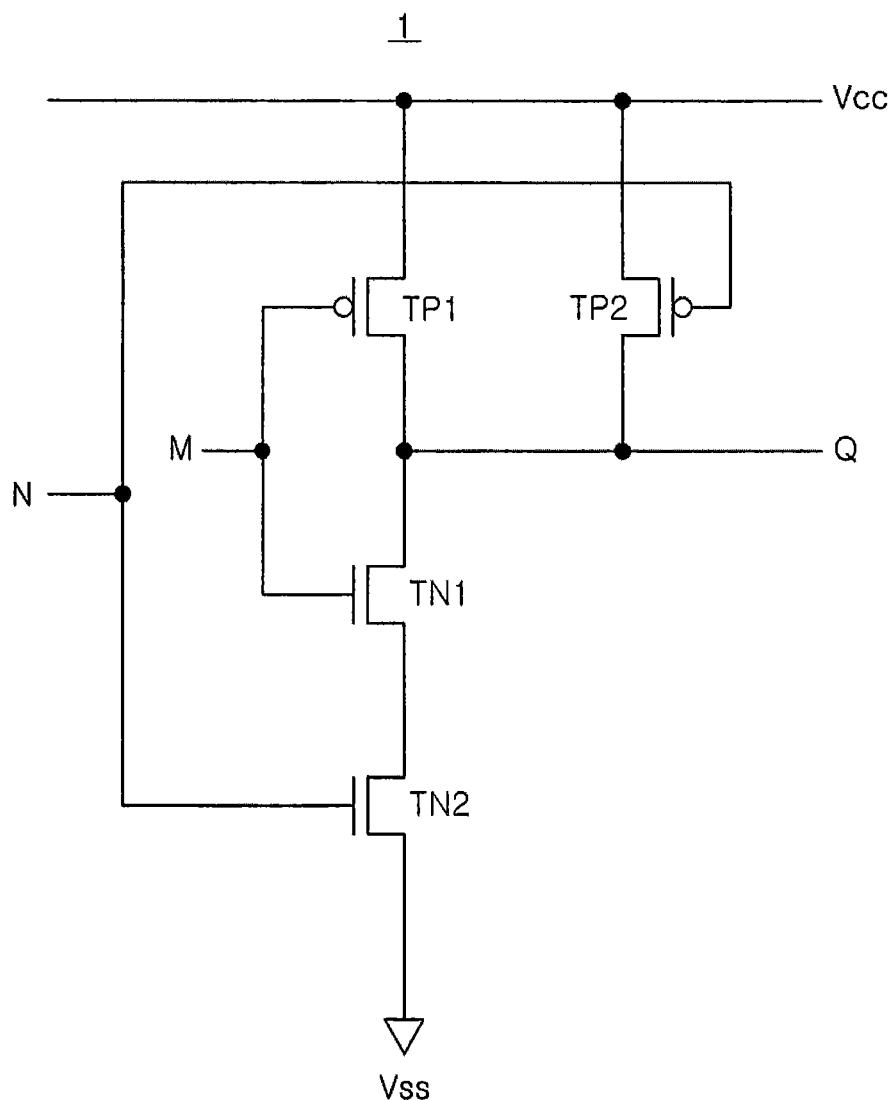
FIG. 7 is a circuit diagram of a semiconductor device according to some embodiments of the present inventive concept.
Figure 8:
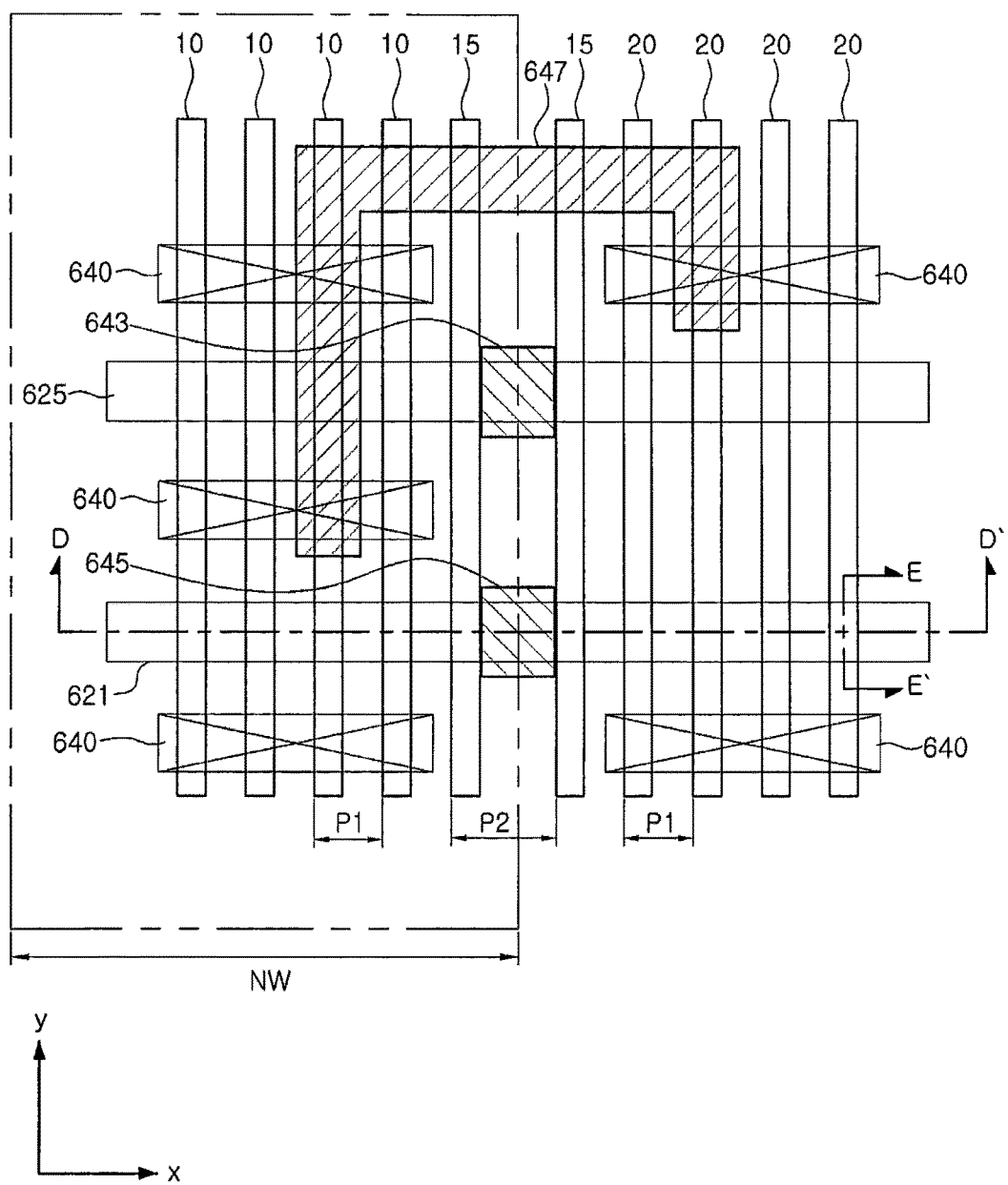
FIG. 8 is a layout diagram of the semiconductor device of FIG. 7 according to some embodiments of the present inventive concept.

FIG. 7 is a circuit diagram of the semiconductor device according to some embodiments of the present inventive concept. FIG. 8 is a layout diagram of the semiconductor device of FIG. 7 according to some embodiments of the present inventive concept.

In particular, a semiconductor device 1 illustrated in FIG. 7 and FIG. 8 may be provided as a NAND gate cell. The illustration of FIGS. 7 and 8 is provided as an example, and thus, embodiments of the present inventive concept are not limited to this configuration.

Referring now to FIG. 7, a NAND gate cell may be configured to receive two input signals M and N and output a signal provided after a NAND operation is performed.

The NAND gate cell may be configured to include a PMOS transistor TP1 transferring a "high" logic value to an output terminal Q when the input signal M has a "low" logic value, NMOS transistors TN1 and TN2 being turned on and transferring a "low" logic value to the output terminal Q when the both input signals M and N have "high" logic values, and a PMOS transistor TP2 transferring a "high" logic value to the output terminal Q when the input signal N has a "low" logic value.

In the NAND gate having the aforementioned configuration, when both input signals M and N have "high" logic values, the PMOS transistors TP1 and TP2 may be turned off and the NMOS transistors TN1 and TN2 may be turned on, such that a "low" logic value is output to the output terminal Q.

When both input signals M and N have "low" logic values, the PMOS transistors TP1 and TP2 may be turned on and the NMOS transistors TN1 and TN2 may be turned off, such that a "high" logic value is output to the output terminal Q.

Referring now to FIG. 8, a substrate may include an N-well region NW doped with an N-type impurity and a region doped with a P-type impurity. First active patterns 10 are formed in the N-well region NW, and first active patterns 20 are formed in the region doped with the P-type impurity. Portions of second active patterns 15 may be formed in the N-well region NW, and the rest of the second active patterns 15 may be formed in the region doped with the P-type impurity. Hereinafter, for convenience in describing FIG. 8, the first active patterns 10 formed in the N-well region NW may be renamed first active fins 10, the first active patterns 20 formed in the region doped with the P-type impurity may be renamed second active fins 20, and the second active patterns 15 may be renamed third active fins 15.

The first active fins 10, the second active fins 20, and the third active fins 15, spaced apart from each other, may be formed to extend in a single direction (e.g. a Y-direction). Gate electrodes 621 and 625 may be formed to extend in another direction (e.g. an X-direction). The gate electrodes 621 and 625 may be extended to intersect with all of the first active fins 10, the second active fins 15, and the third active fins 20.

Source/drain regions, not illustrated, may be formed in the active fins 10, 15, and 20, on both sides of the portions in which the gate electrodes 621 and 625 intersect the active fins 10, 15, and 20.

Further, source/drain contacts 640 connected to the source/drain regions may be formed. Input terminals 643 and 645 and connected to each of the gate electrodes and an output terminal 647 connected to one gate electrode may be formed.

The first active fins 10 may configure the PMOS transistors, and the second active fins 20 may configure the NMOS transistors. In detail, since two gate electrodes 621 and 625 and three source/drain contacts 640 are disposed on the first active fins 10, the first active fins 10 may configure two PMOS transistors connected to each other in parallel. In addition, since two gate electrodes 621 and 625 and two source/drain contacts 640 are disposed on the second active fins 20, the second active fins 20 may configure two NMOS transistors connected to each other in series.

FIG. 9A to FIG. 9F are cross sections illustrating processing steps in the fabrication of semiconductor device according to some embodiments of the present inventive concept. The semiconductor device taken along line D-D' of FIG. 8 and the semiconductor device taken along line E-E' of FIG. 8 are illustrated in FIG. 9A to FIG. 9F. FIG. 9A to FIG. 9F are views schematically illustrating subsequent processes of manufacturing the semiconductor device based on a configuration of the semiconductor device of FIG. 2J.

Figure 9A:
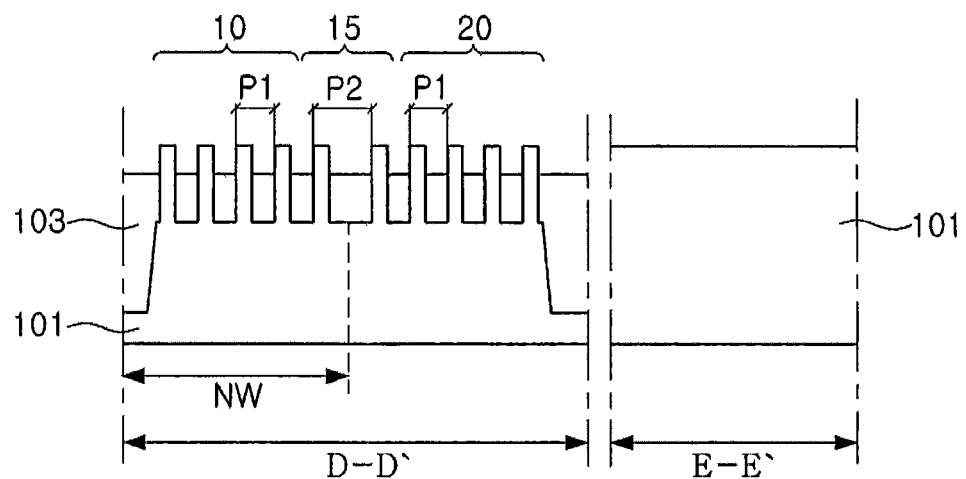
FIGS. 9A through 9F are cross-sections illustrating processing steps in the fabrication of semiconductor devices according to some embodiments of the present inventive concept.

Referring first to FIG. 9A is a view illustrating a result of performing processes described with reference to FIG. 2A to FIG. 2J. Referring to FIG. 9A, a substrate 101 may include an N-well region NW. A region except for the N-well region NW may be a region doped with a P-type impurity. The N-well region NW may be formed in the substrate 101 before the active patterns 10, 15, and 20 are formed.

Figure 9B:
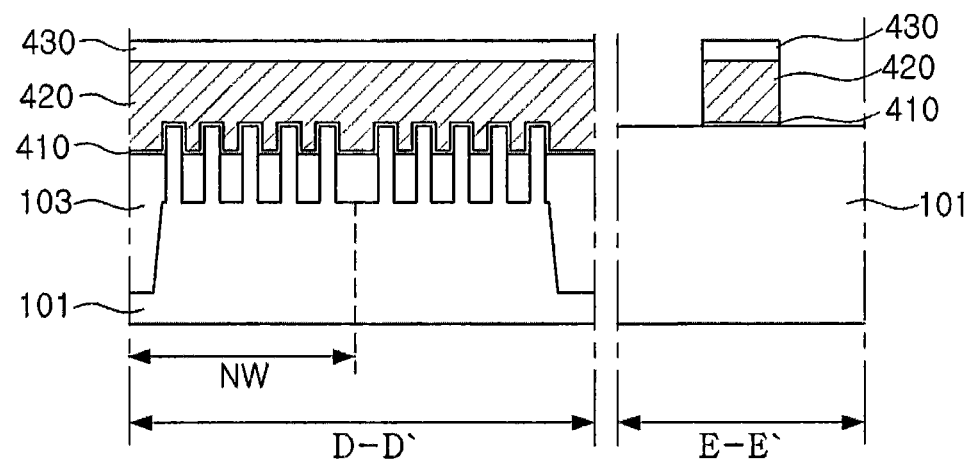

Referring to FIG. 9B, a sacrificial gate insulation layer 410 covering the active patterns 10, 15, and 20 protruding above a device isolation layer 103 and a sacrificial gate electrode 420 formed thereon may be provided.

First, the sacrificial gate insulation layer 410, the sacrificial gate electrode 420, and a mask layer 430 may be sequentially stacked. The mask layer 430 may be patterned, and the sacrificial gate electrode 420 may be patterned by using the patterned mask layer as an etching mask.

The sacrificial gate insulation layer 410 may include at least one of silicon oxide film and silicon oxynitride film, but is not limited thereto. The sacrificial gate electrode 420 may be formed of polycrystalline silicon, but is not limited thereto.

Figure 9C:
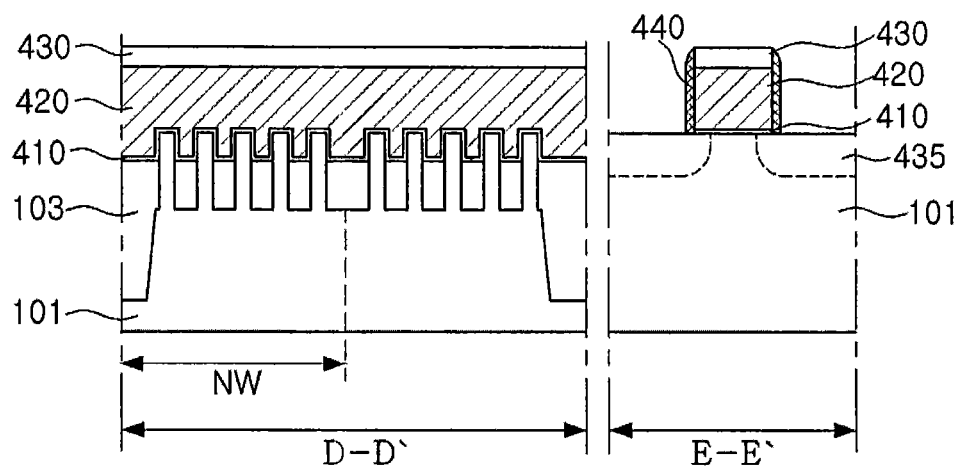

Referring to FIG. 9C, gate spacers 440 may be formed on side surfaces of the sacrificial gate electrode 420, and source/drain regions 435 may be formed in active patterns exposed to sides of the sacrificial gate electrode 420.

The gate spacers 440 may be formed by conformally forming a spacer material layer on the sacrificial gate electrode 420 and then etching back the spacer material layer. The source/drain region 435 may be formed by performing an impurity ion implantation process. In order to activate the impurity, a heat treatment process may be performed after the ion implantation process.

Figure 9D:
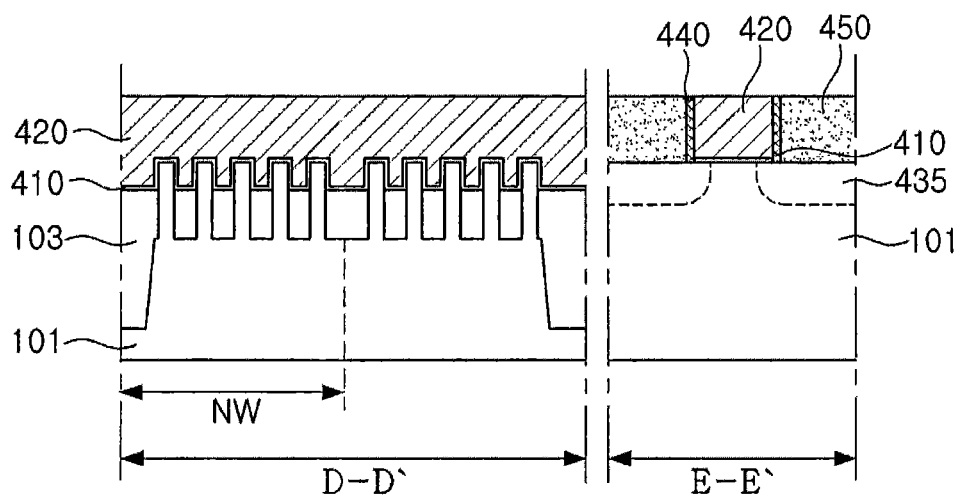

Referring to FIG. 9D, an interlayer insulation layer 450 surrounding the sacrificial gate electrode 420 and the gate spacers 440 and exposing an upper surface of the sacrificial gate electrode 420 thereto may be formed.

The interlayer insulation layer 450 covering the sacrificial gate electrode 420 and the gate spacers 440 may be formed. A planarization process may be performed so that the upper surface of the sacrificial gate electrode 420 may be exposed. The formation of the interlayer insulation layer 450 may be completed through the planarization process.

The planarization of the interlayer insulation layer 450 may be performed using a chemical mechanical polishing (CMP) process.

Figure 9E:
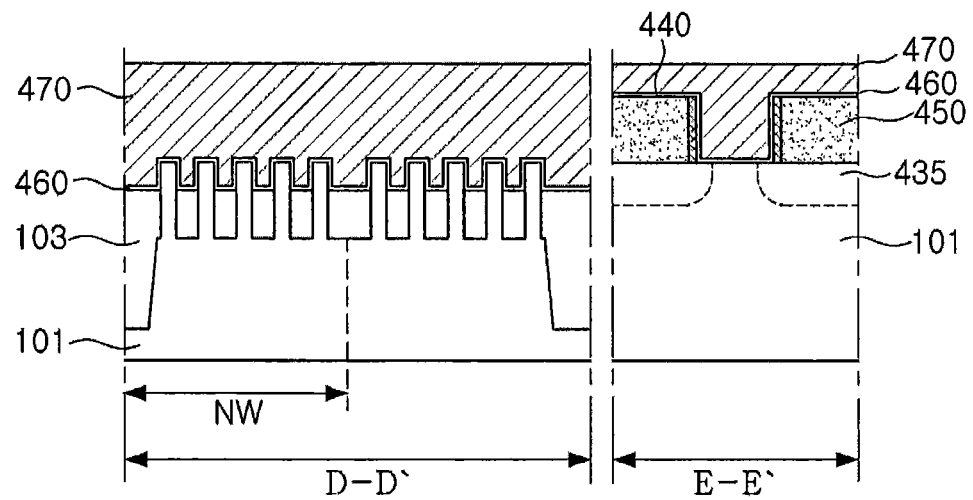
Figure 9F:
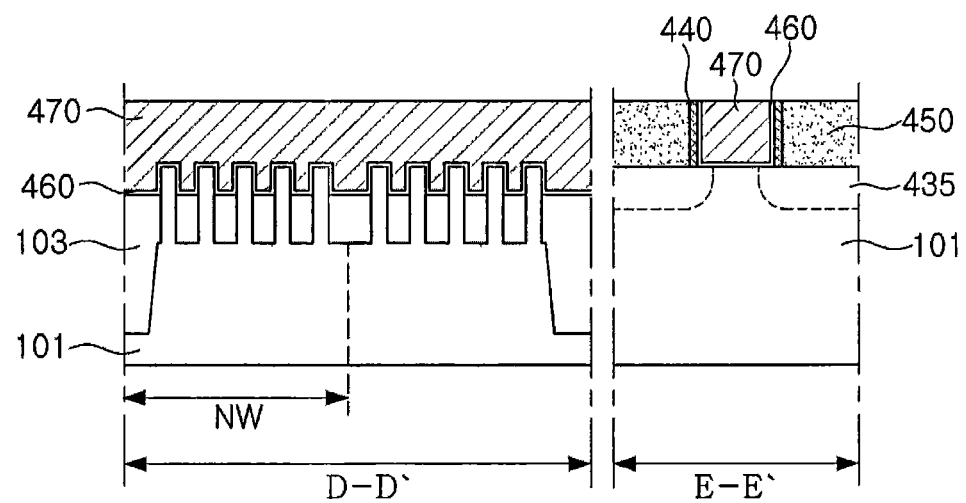

Referring to FIG. 9E and FIG. 9F, a gate insulation layer 460 and a gate electrode 470 may be formed.

A trench may be formed in the interlayer insulation layer 450 by removing the sacrificial gate electrode 420 and the sacrificial gate insulation layer 410. The gate insulation layer 460 and the gate electrode 470 may be conformally formed in the trench. A planarization process may be performed so that an upper surface of the interlayer insulation layer 450 may be exposed. A formation of the gate electrode 470 may be completed through the planarization process.

The gate insulation layer 460 may be configured of a high dielectric layer. The high dielectric layer may refer to an insulation layer formed using an insulation material having a dielectric constant higher than a dielectric constant of a silicon oxide film, and may be at least one of a tantalum oxide film, a titanium oxide film, a hafnium oxide film, a zirconium oxide film, an aluminum oxide film, an yttrium oxide film, a niobium oxide film, hafnium silicate, and zirconium silicate. The gate insulation layer 460 may be formed using chemical vapor deposition (CVD) or atomic layer deposition (ALD).

The gate electrode 470 may include at least one work function-controlling film and at least one gate metal. The work function-controlling film may be formed using one selected from a group consisting of TiN, TaN, WN, TiAl, TiAlN, TaC, TiC, and the like. The gate metal may be formed of at least one of aluminum (Al), tungsten (W), molybdenum (Mo), and the like. The work function-controlling film may serve as a diffusion barrier against the gate metal. The gate electrode 470 may be formed using chemical vapor deposition or atomic layer deposition, depending on a material thereof.

The work function-controlling film in the N-well region NW may be different from a work function-controlling film in a region doped with a P-type impurity, and to this end, an additional process may be required.

Figure 10:
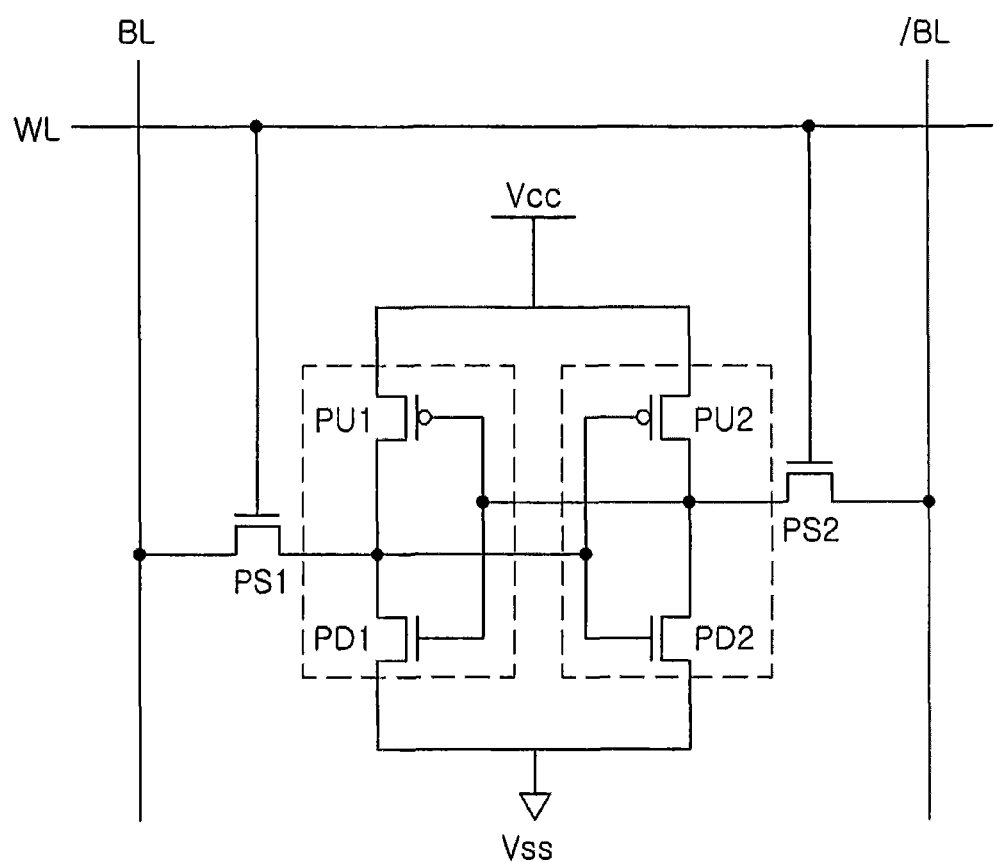
FIG. 10 is a circuit diagram of a semiconductor device according to some embodiments of the present inventive concept.
Figure 11:
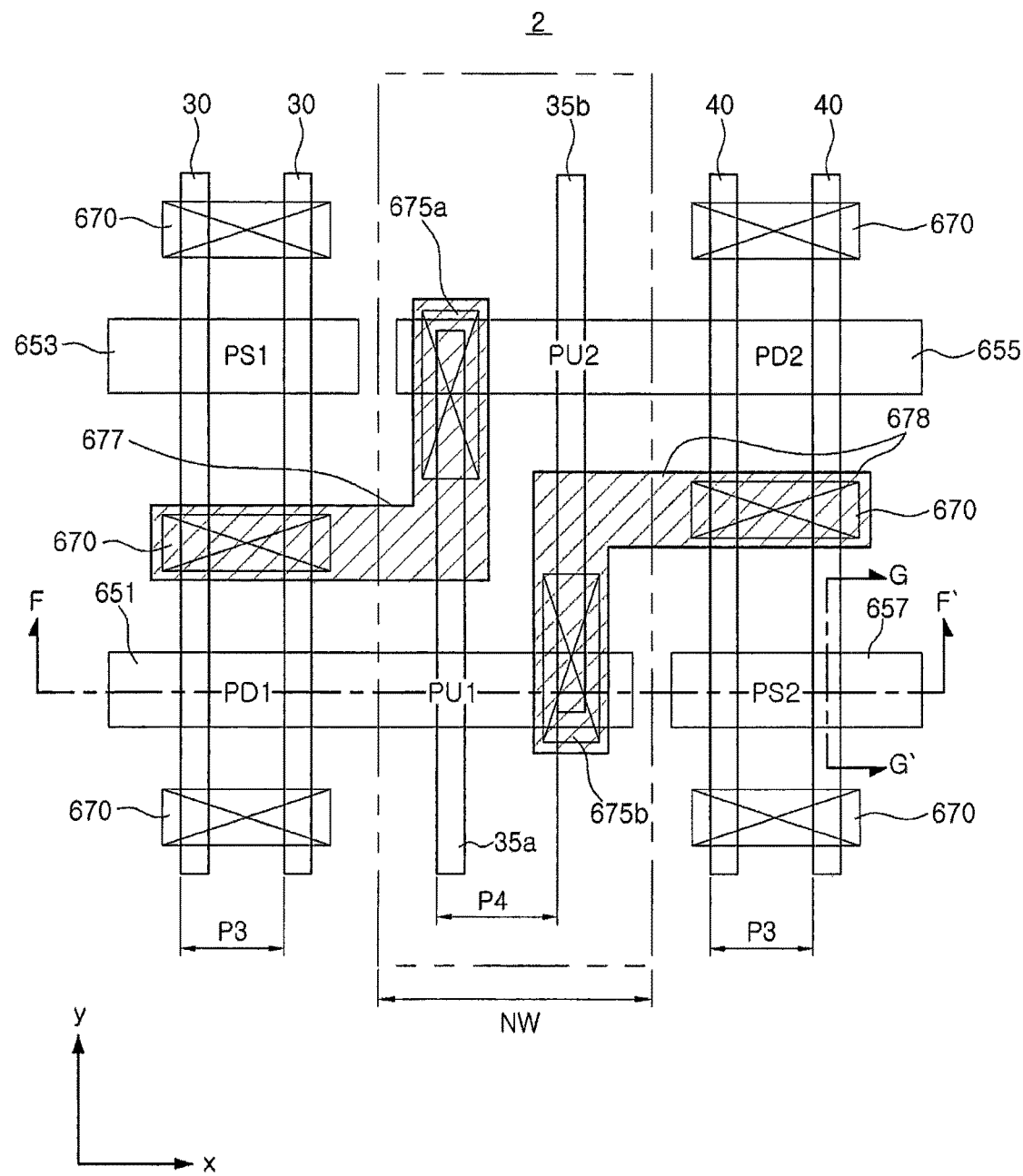
FIG. 11 is a layout diagram of the semiconductor device of FIG. 10 according to some embodiments of the present inventive concept.

FIG. 10 is a circuit diagram illustrating a semiconductor device according to some embodiments of the present inventive concept, and FIG. 11 is a layout diagram illustrating the semiconductor device of FIG. 10 according to some embodiments of the present inventive concept.

In particular, a semiconductor device 2 illustrated in FIG. 10 and FIG. 11 may be provided as a static random access memory (SRAM) cell configured of six transistors by way of example, but is not limited thereto.

Referring to FIG. 10, the SRAM cell may include a pair of inverters INV1 and INV2 connected to each other in parallel between a power node Vcc and a ground node Vss, and a first pass transistor PS1 and a second pass transistor PS2 connected to respective output nodes of the inverters INV1 and INV2. The first pass transistor PS1 and the second pass transistor PS2 may be respectively connected to a bit line BL and a complementary bit line BL/. Gates of the first pass transistor PS1 and the second pass transistor PS2 may be connected to a word line WL.

The first inverter INV1 may include a first pull-up transistor PU1 and a first pull-down transistor PD1 connected to each other in series, and the second inverter INV2 may include a second pull-up transistor PU2 and a second pull-down transistor PD2 connected to each other in series. The first pull-up transistor PU1 and the second pull-up transistor PU2 may be PMOS transistors, and the first pull-down transistor PD1 and the second pull-down transistor PD2 may be NMOS transistors.

An input node of the first inverter INV1 may be connected to an output node of the second inverter INV2, and an input node of the second inverter INV2 may be connected to an output node of the first inverter INV1, such that the first inverter INV1 and the second inverter INV2 may configure a latch circuit.

Referring to FIG. 11, a substrate may include an N-well region NW doped with an N-type impurity and a region doped with a P-type impurity. First active patterns 30 and 40 having a first pitch P1 may be formed in the region doped with a P-type impurity, and second active patterns 35 having a second pitch P2 may be formed in the N-well region NW. For convenience in describing FIG. 11, the first active patterns 30 formed in the region doped with a P-type impurity may be renamed first active fins 30, and the first active patterns 40 may be renamed fourth active fins 40. A second active pattern 35a formed in the N-well region NW may be renamed a second active fin 35a, and a second active pattern 35b may be renamed a third active fin 35b.

The first active fins 30, the second active fin 35a, the third active fin 35b, and the fourth active fins 40, spaced apart from each other, may be formed to extend lengthwise in one direction (e.g. a Y direction). Extended lengths of the second active fin 35a and the third active fin 35b may be shorter than those of the first active fins 30 and the fourth active fins 40. The second active fin 35a and the third active fin 35b may configure a PMOS transistor, and the first active fins 30 and the fourth active fins 40 may configure a NMOS transistor.

A first gate electrode 651, a second gate electrode 653, a third gate electrode 655, and a fourth gate electrode 657 may be formed to extend lengthwise in another direction (e.g. an X direction) and intersect the first to fourth active fins 30, 35a, 35b, and 40. In detail, the first gate electrode 651 may completely intersect the first active fins 30 and the second active fin 35a and may partially overlap with an end portion of the third active fin 35b. The third gate electrode 655 may completely intersect the fourth active fins 40 and the third active fin 35b and may partially overlap with an end portion of the second active fin 35a. The second gate electrode 653 may be formed to intersect the first active fins 30, and the fourth gate electrode 657 may be formed to intersect the fourth active fins 40.

As illustrated in FIG. 11, the first pull-up transistor PU1 may be defined in a region in which the first gate electrode 651 and the second active pin 35a intersect with each other, the first pull-down transistor PD1 may be defined in a region in which the first gate electrode 651 and the first active fins 30 intersect with each other, and the first pass transistor PS1 may be defined in a region in which the second gate electrode 653 and the first active fins 30 intersect with each other. The second pull-up transistor PU2 may be defined in a region in which the third gate electrode 653 and the third active pin 35b intersect with each other, the second pull-down transistor PD2 may be defined in a region in which the third gate electrode 655 and the fourth active fins 40 intersect with each other, and the second pass transistor PS2 may be defined in a region in which the fourth gate electrode 657 and the fourth active fins 40 intersect with each other.

Source/drain regions, not illustrated, may be formed in the first to fourth active fins 30, 35a, 35b, and 40, on both sides of the portions in which the first to fourth gate electrodes 651, 653, 655, and 657 intersect the first to fourth active fins 30, 35a, 35b, and 40.

In addition, a plurality of source/drain contacts 670 respectively connected to the source/drain regions may be formed.

Further, a first shared contact 675A may connect the second active pin 35a, a third gate line 655, and a wiring 677 all together. A second shared contact 675B may connect the third active pin 35b, a first gate line 651, and a wiring 678 all together.

FIG. 12A to FIG. 12F are cross-sections illustrating processing steps in the fabrication of a semiconductor device according to some embodiments of the present inventive concept. The semiconductor device taken along line F-F' of FIG. 11 and the semiconductor device taken along line G-G' of FIG. 11 are illustrated in FIG. 12A to FIG. 12F. FIG. 12A to FIG. 12F are views schematically illustrating subsequent processes of manufacturing a semiconductor device 2 according to some embodiments of the present inventive concept, based on the configuration of the semiconductor device of FIG. 4J.

Figure 12A:
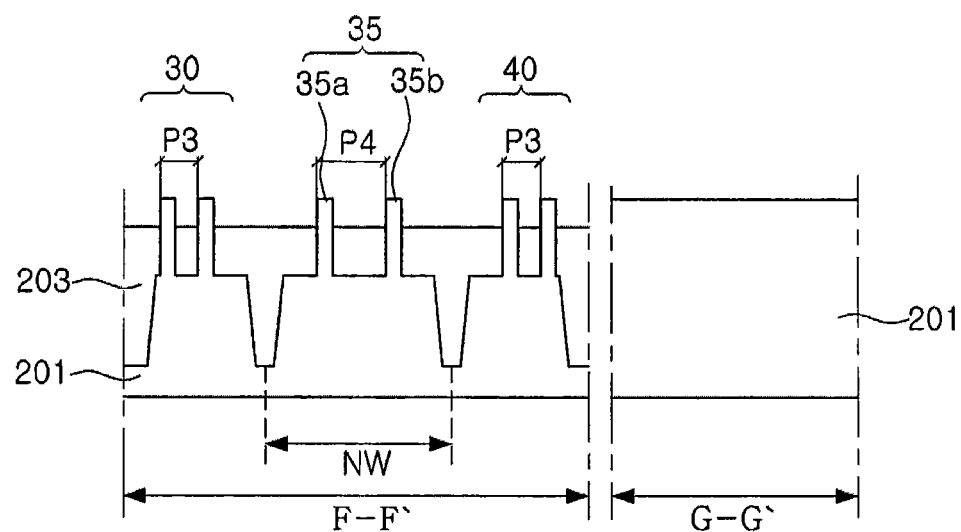
FIGS. 12A through 12F are cross-sections illustrating processing steps in the fabrication of semiconductor devices according to some embodiments of the present inventive concept.

FIG. 12A is a view illustrating a result of performing processes described with reference to FIG. 4A to FIG. 4J. Referring to FIG. 12A, the substrate 201 may included an N-well region NW. A region except for the N-well region NW may be a region doped with a P-type impurity. The N-well region NW may be formed in the substrate 201 before the active patterns 30, 35, and 40 are formed.

Figure 12B:
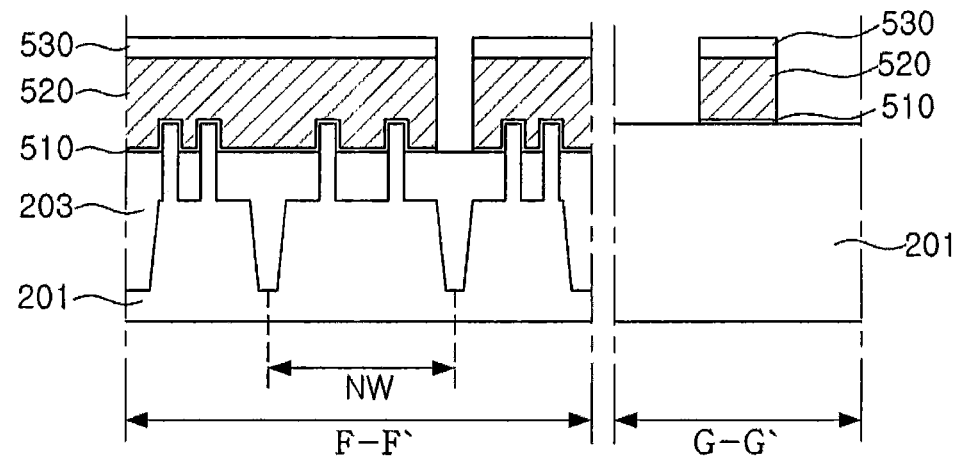

Referring to FIG. 12B, a sacrificial gate insulation layer 510 covering the active patterns 30, 35, and 40 protruding above a device isolation layer 203, and a sacrificial gate electrode 520 provided thereon, may be formed.

The sacrificial gate insulation layer 510, the sacrificial gate electrode 520, and a mask layer 530 may be sequentially stacked. The mask layer 530 may be patterned, and the sacrificial gate electrode 520 may be patterned by using the patterned mask layer as an etching mask.

The sacrificial gate insulation layer 510 may include at least one of silicon oxide film and silicon oxynitride film, but is not limited thereto. The sacrificial gate electrode 520 may be formed of polycrystalline silicon, but is not limited thereto.

Figure 12C:
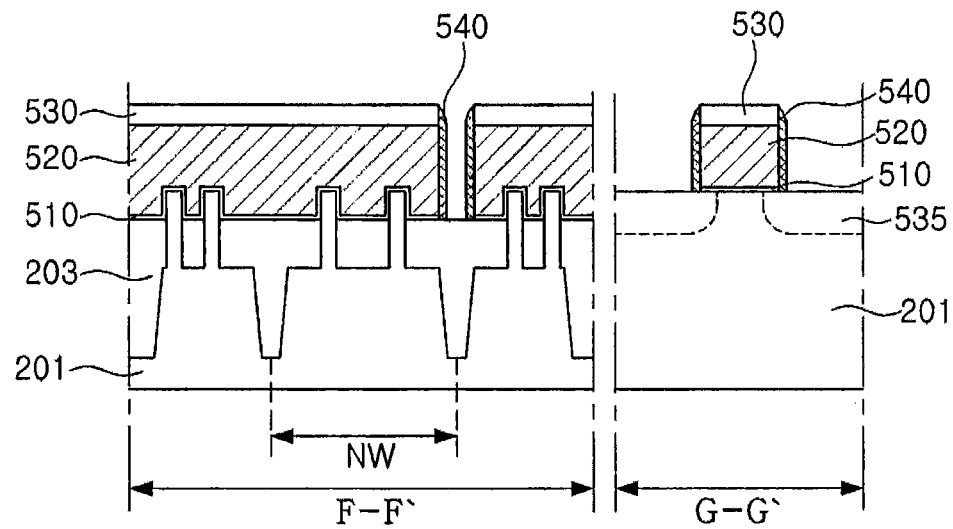

Referring to FIG. 12C, gate spacers 540 may be formed on side surfaces of the sacrificial gate electrode 520, and a source/drain region 535 may be formed in active patterns exposed to sides of the sacrificial gate electrode 520.

The gate spacers 540 may be formed by conformally forming a spacer material layer on the sacrificial gate electrode 520 and then etching back the spacer material layer. The source/drain region 535 may be formed by performing an impurity ion implantation process. In order to activate the impurity, a heat treatment process may be performed after the ion implantation process.

Figure 12D:
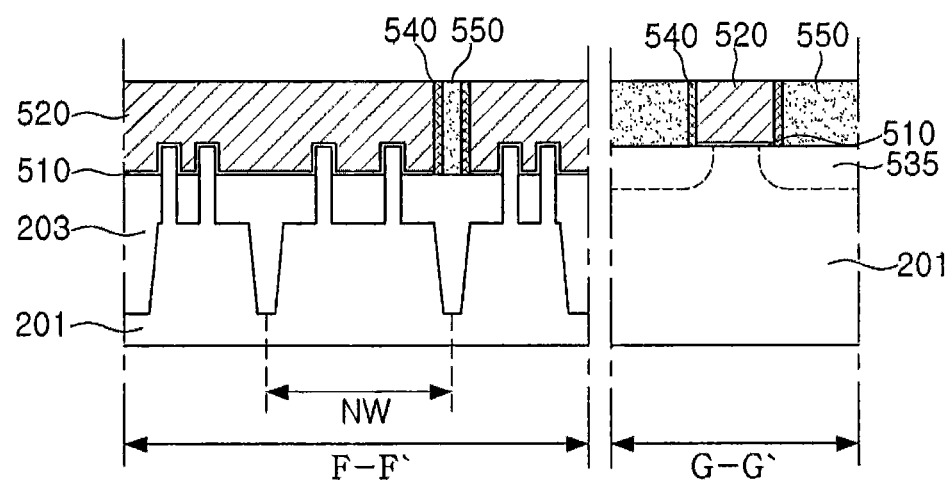

Referring to FIG. 12D, an interlayer insulation layer 550 surrounding the sacrificial gate electrode 520 and the gate spacers 540 and allowing an upper surface of the sacrificial gate electrode 520 to be exposed thereto may be formed.

The interlayer insulation layer 550 covering the sacrificial gate electrode 520 and the gate spacers 540 may be formed, and a planarization process may be performed so that the upper surface of the sacrificial gate electrode 520 may be exposed. The formation of the interlayer insulation layer 550 may be completed through the planarization process.

The planarization of the interlayer insulation layer 550 may be performed using a chemical mechanical polishing (CMP) process.

Figure 12E:
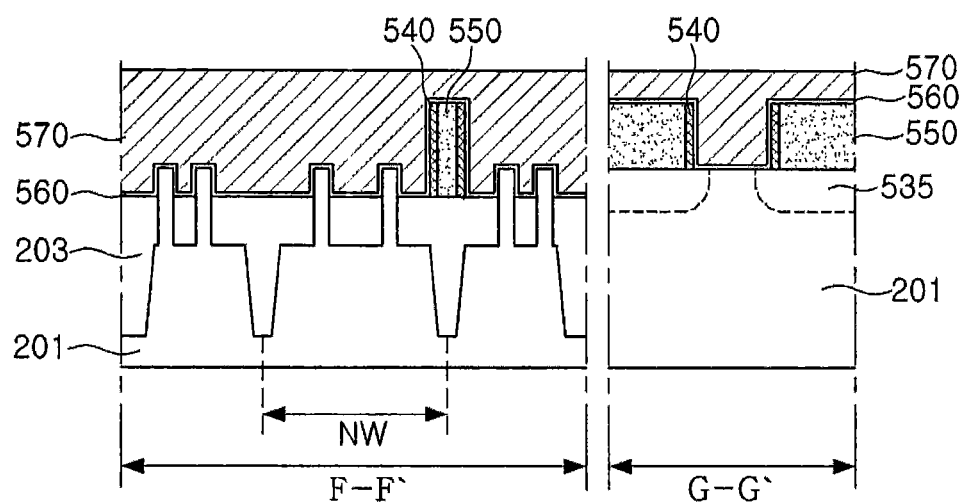
Figure 12F:
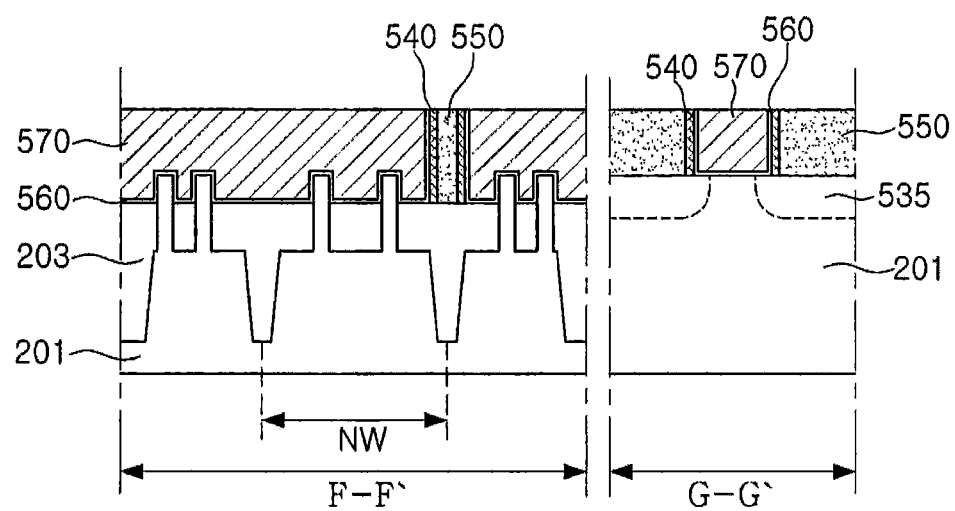

Referring to FIG. 12E and FIG. 12F, a gate insulation layer 560 and a gate electrode 570 may be formed.

A trench may be formed in the interlayer insulation layer 550 by removing the sacrificial gate electrode 520 and the sacrificial gate insulation layer 510. The gate insulation layer 560 and the gate electrode 570 may be conformally formed in the trench. A planarization process may be performed so that an upper portion of the interlayer insulation layer 550 may be exposed. A formation of the gate electrode 570 may be completed through the planarization process.

The gate insulation layer 560 may include a high dielectric layer. The high dielectric layer may refer to an insulation layer that is formed using an insulation material having a dielectric constant higher than that of a silicon oxide film, and may be at least one of a tantalum oxide film, a titanium oxide film, a hafnium oxide film, a zirconium oxide film, an aluminum oxide film, an yttrium oxide film, a niobium oxide film, hafnium silicate, and zirconium silicate. The gate insulation layer 560 may be formed using chemical vapor deposition or atomic layer deposition.

The gate electrode 570 may include at least one work function-controlling film and at least one gate metal. The work function-controlling film may be one selected from a group consisting of TiN, TaN, WN, TiAl, TiAlN, TaC, TiC, and the like. The gate metal may be at least one of aluminum (Al), tungsten (W), molybdenum (Mo), and the like. The work function-controlling film may serve as a diffusion barrier against the gate metal. The gate electrode 570 may be formed using chemical vapor deposition or atomic layer deposition, depending on the material thereof.

The work function-controlling film in the N-well region NW may be different from the work function-controlling film in a region doped with a P-type impurity, and to this end, an additional process may be required.

Figure 13:
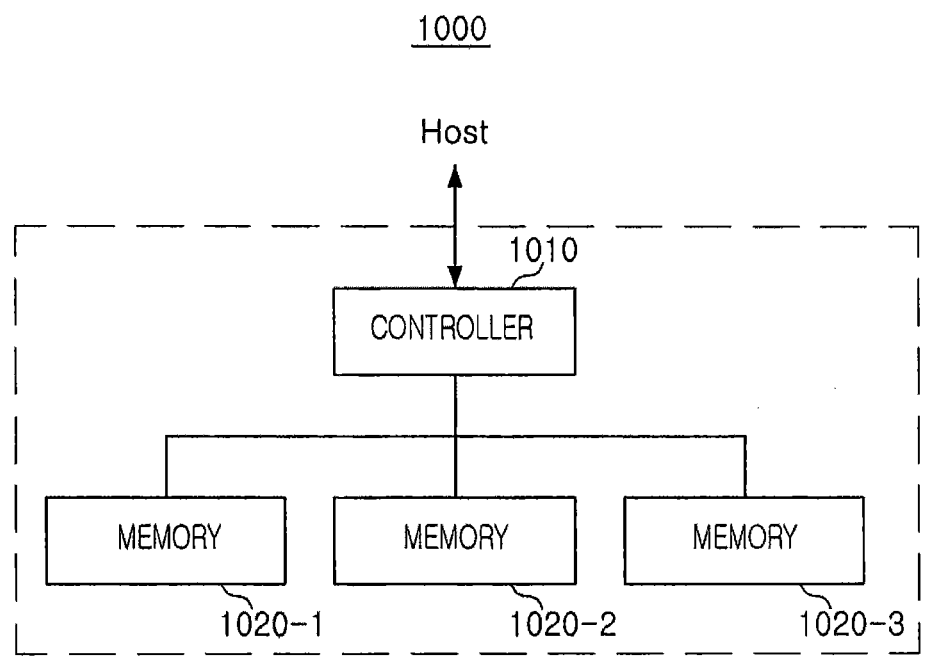
FIG. 13 is a block diagram illustrating a storage device including the semiconductor device according to some embodiments of the present inventive concept.

Referring now to FIG. 13, a block diagram illustrating a storage device including a semiconductor device according to some embodiments of the present inventive concept will be discussed. As illustrated in FIG. 13, the storage device 1000 according to some embodiments of the present inventive concept may include a controller 1010 communicating with a host, and memories 1020-1, 1020-2, and 1020-3 storing data. The controller 1010 and the memories 1020-1, 1020-2, and 1020-3 may respectively include the semiconductor device according to some embodiments of the present inventive concept.

The host communicating with the controller 1010 may be provided as various electronic devices equipped with the storage device 1000. For example, the host may be a smartphone, a digital camera, a desktop computer, a laptop computer, a media player, or the like. The controller 1010 may store data in the memories 1020-1, 1020-2, and 1020-3 after receiving a request for writing or reading data, transferred from the host, or generate a command (CMD) to retrieve data from the memories 1020-1, 1020-2, and 1020-3.

As illustrated in FIG. 13, one or more memories 1020-1, 1020-2, and 1020-3 may be connected to the controller 1010 in parallel in the storage device. The storage device 1000 having a relatively large capacity, such as a solid state drive (SSD) may be implemented by connecting the plurality of the memories 1020-1, 1020-2, and 1020-3 to the controller 1010 in parallel.

Figure 14:
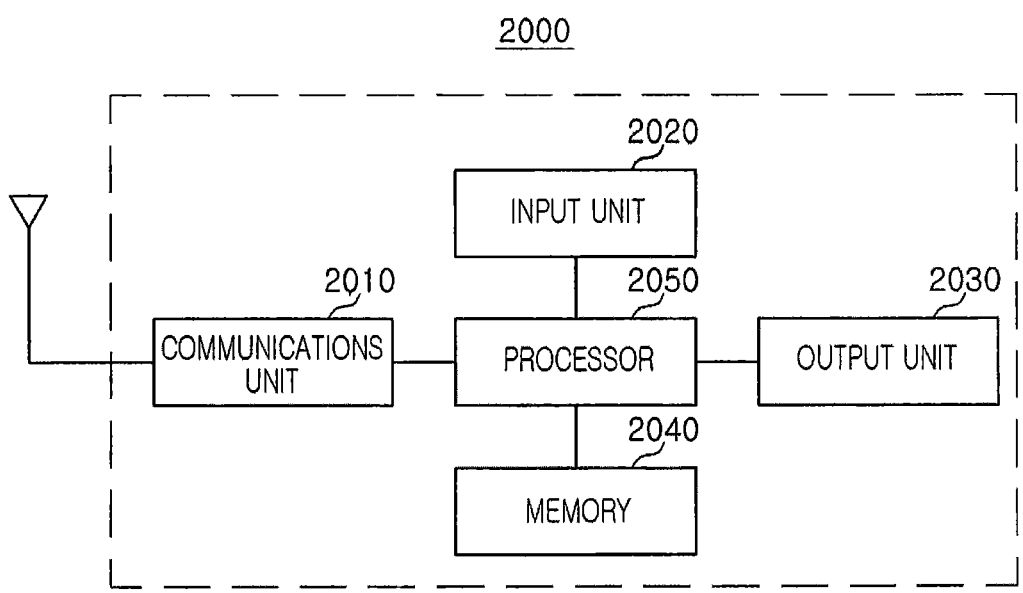
FIG. 14 is a block diagram illustrating an electronic device including the semiconductor device according to some embodiments of the present inventive concept.

Referring to FIG. 14, a block diagram illustrating an electronic device including a semiconductor device according to some embodiments of the present inventive concept will be discussed. As illustrated in FIG. 14, an electronic device 2000 according to some embodiments of the present inventive concept may include a communications unit 2010, an input unit 2020, an output unit 2030, a memory 2040, and a processor 2050.

The communications unit 2010 may include a wire/wireless communications module and may include a wireless internet module, a short-range communications module, a global positioning system (GPS) module, a mobile communications module, and the like. A Wire/wireless communications module included in the communications unit 2010 may be connected to an external communications network based on various communications standards so as to transmit and receive data.

The input unit 2020 may be provided to allow a user to control operations of the electronic device 2000, and may include a mechanical switch, a touch screen, a voice recognition module, and the like. Furthermore, examples of the input unit 2020 may include a trackball mouse, a laser pointer mouse, and a finger mouse, and may further include various sensor modules allowing a user to input data.

Information processed by the electronic device 2000 may be output in a form of voice or image by the output unit 2030, and the memory 2040 may store a program for processing and controlling operations of the processor 2050, or may store data therein. The processor 2050 may store or retrieve data by transmitting command to the memory 2040 according to required operation. The processor 2050 and the memory 2040 may include a semiconductor device according to some embodiments of the present inventive concept.

The memory 2040 may be installed in the electronic device 2000 or communicate with the processor 2050 through a separate interface. When the memory 2040 communicates with the processor 2050 through a separate interface, the processor 2050 may store data in the memory 2040 or retrieve data therefrom through various interface standards such as SD, SDHC, SDXC, MICRO SD, USB, and the like.

The processor 2050 may control operations of respective units included in the electronic device 2000. The processor 2050 may perform controlling and processing related to audio calls, video calls, data communications, and the like, or controlling and processing for playing and managing a multimedia. Furthermore, the processor 2050 may process an input transmitted through the input unit 2020 from a user and may output a corresponding result thereof through the output unit 2030. The processor 2050 may store data required to control operations of the electronic device 2000 in the memory 2040 or retrieve data from the memory 2040.

Figure 15:
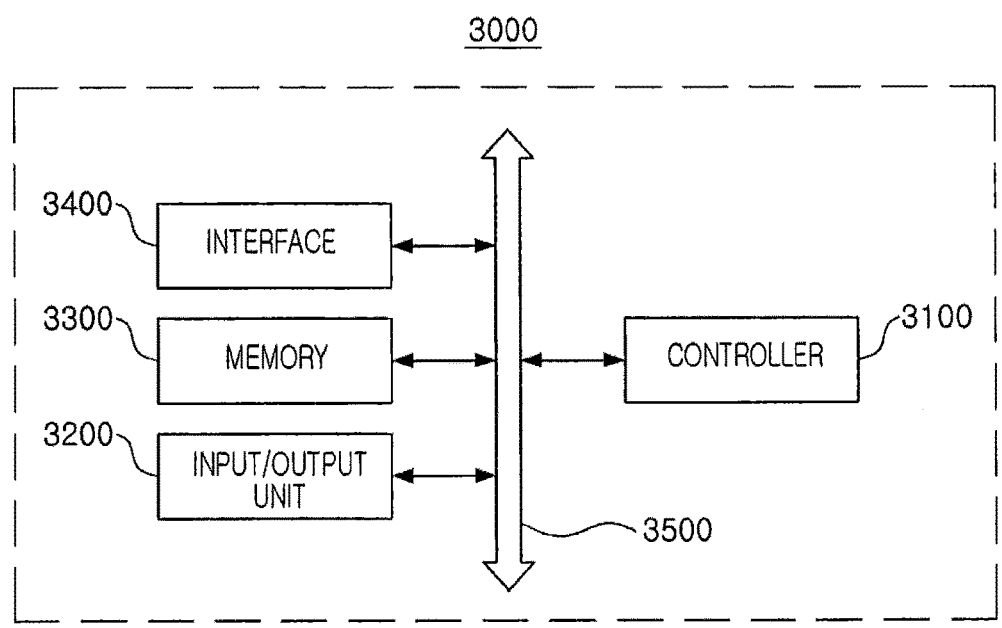
FIG. 15 is a schematic view illustrating a system including the semiconductor device according to some embodiments of the present inventive concept.

Referring now to FIG. 15, a view schematically illustrating a system including a semiconductor device according to some embodiments of the present inventive concept will be discussed. As illustrated in FIG. 15, a system 3000 may include a controller 3100, an input/output device 3200, a memory 3300, and an interface 3400. The system 3000 may be a mobile system or a system transmitting or receiving information. The mobile system may be a portable digital assistant (PDA), a portable computer, a tablet PC, a wireless phone, a mobile phone, a digital music player, or a memory card.

The controller 3100 may run a program and control the system 3000. The controller 3100 may be, for example, a microprocessor, a digital signal processor, a microcontroller, or a device similar thereto.

The input/output device 3200 may be used in inputting or outputting data of the system 3000. The system 3000 may be connected to an external device such as a personal computer or a network using the input/output device 3200, and exchange data with the connected external device. The input/output device 3200 may be, for example, a keypad, a keyboard, or a display.

The memory 3300 may store a code for an operation of the controller 3100 and/or data, and/or may store data processed by the controller 3100.

The interface 3400 may be a passage for data transmission between the system 3000 and an external device. The controller 3100, the input/output device 3200, the memory 33000, and the interface 3400 may communicate with each other through a bus 3500.

At least one of the controller 3100 and the memory 3300 may include a semiconductor device according to some embodiments of the present inventive concept.

As set forth above, according to some embodiments of the present inventive concept, a method of manufacturing a semiconductor device using both the quadruple patterning technology and the double patterning technology to easily form active patterns having identical line widths and different pitches may be provided.

According to some embodiments of the present inventive concept, a semiconductor device including active patterns having identical line widths and different pitches may be provided.

While exemplary embodiments have been shown and described above, it will be apparent to those skilled in the art that modifications and variations could be made without departing from the scope of the present invention as defined by the appended claims.

What is claimed is:

1. A method of fabricating a semiconductor device, comprising:
   sequentially stacking hardmask layers, a first sacrificial layer, and a second sacrificial layer on a substrate;
   etching the second sacrificial layer to form first mandrels on the first sacrificial layer;
   forming first spacers on side walls of the first mandrels;
   forming a photoresist pattern disposed outside a region from which the first mandrels have been removed, spaced apart from the first spacers, and having a line width greater than a line width of the first spacers;
   etching the first sacrificial layer using the first spacers and the photoresist pattern as respective etching masks to form second mandrels and a third mandrel, respectively;
   forming second spacers on side walls of the second mandrels and third spacers on side walls of the third mandrel;
   forming first active patterns having a first pitch and second active patterns having a second pitch greater than the first pitch, by etching the hardmask layer and at least a portion of the substrate using the second and third spacers as respective etching masks; and
   forming a device isolation layer so that upper portions of the first active patterns and the second active patterns protrude therefrom.

2. The method of claim 1, wherein the first pitch ranges from 30 nm to 35 nm, and the second pitch ranges from 40 nm to 50 nm.

3. The method of claim 1, wherein forming the second and third spacers is followed by removing the second mandrels and the third mandrel such that the second spacers and the third spacers having different pitches are retained in linear form.

4. The method of claim 1:
   wherein pitches of the second spacers are determined by a line width of the first spacer; and
   wherein pitches of the third spacers are determined by a line width of the photoresist pattern.

5. The method of claim 1, wherein the pitches of the third spacers are greater than the pitches of the second spacers.

6. The method of claim 1, wherein the forming of the first spacers on side walls of the first mandrels comprises:
   forming a first spacer material layer conformally covering the first mandrels; and etching back the first spacer material layer.

7. The method of claim 1, wherein the forming of the second spacers and the third spacers on side walls of the second mandrels and the third mandrel comprises:
   forming a second spacer material layer conformally covering the second mandrels and the third mandrel; and
   etching back the second spacer material layer.

8. The method of claim 1, wherein the first sacrificial layer and the second sacrificial layer comprises one of polycrystalline silicon, amorphous silicon, and spin on hardmask (SOH).

9. The method of claim 1, wherein the hardmask layers comprises at least one of polycrystalline silicon, silicon oxide, and silicon nitride.

10. A method of fabricating a semiconductor device, comprising:
    sequentially stacking hardmask layers, a first sacrificial layer, and a second sacrificial layer on a substrate;
    etching the second sacrificial layer using a first photoresist pattern fanned on the second sacrificial layer as an etching mask to form first mandrels;
    forming first spacers on side walls of the first mandrels;
    forming a second photoresist pattern in a region from which the first mandrels have been removed, spaced apart from the first spacers, and having a line width greater than a line width of the first spacers;
    etching the first sacrificial layer using the first spacers and the second photoresist pattern as respective etching masks to form second mandrels and a third mandrel, respectively, having different line widths;
    forming second spacers on side walls of the second mandrels and third spacers on side walls of the third mandrel;
    etching the hardmask layers using the second spacers and the third spacers having different pitches as an etching mask to form a hardmask pattern;
    etching the substrate using the hardmask pattern as an etching mask to form first active patterns having a first pitch and second active patterns having a second pitch greater than the first pitch; and
    forming a device isolation layer so that upper portions of the first active patterns and the second active patterns protrude therefrom.

11. The method of claim 10, wherein the first pitch ranges from 30 nm to 35 nm, and the second pitch ranges from 40 nm to 50 nm.

12. The method of claim 10, wherein distances between the second photoresist pattern and the first spacers adjacent to the second photoresist are substantially the same.

13. The method of claim 10, wherein a line width of the third mandrel is greater than a line width of the second mandrel.

14. The method of claim 10, wherein forming the second spacers and the third spacers is followed by removing the second mandrels and the third mandrel such that the second spacers and the third spacers having different pitches are retained in linear form.

15. The method of claim 10:
wherein pitches of the second spacers are determined by a line width of the first spacers; and
wherein pitches of the third spacers are determined by a line width of the second photoresist pattern.

16. The method of claim 10, wherein pitches of the third spacers are greater than pitches of the second spacers.

17. A method of manufacturing a semiconductor device, comprising:
sequentially stacking hardmask layers, a first sacrificial layer, and a second sacrificial layer on a substrate having a first region and a second region;
forming a first photoresist pattern on the second sacrificial layer in the first region;
etching the second sacrificial layer using the first photoresist pattern as an etching mask to form first mandrels on the first sacrificial layer in the first region;
forming first spacers on side walls of the first mandrels in the first region;
forming a second photoresist pattern on the first sacrificial layer in the first region, to be spaced apart from the first spacers and disposed outside a region from which the first mandrels have been removed, and forming a third photoresist pattern and a forth photoresist pattern having different line widths on the first sacrificial layer in the second region;
etching the first sacrificial layer using the first spacer and the second photoresist pattern as respective etching masks to form a second mandrel and a third mandrel, respectively, in the first region;
etching the first sacrificial layer using the third photoresist pattern and the fourth photoresist pattern as respective etching masks to form a forth mandrel and a fifth mandrel, respectively, in the second region;
forming second to fifth spacers on side walls of the second to fifth mandrels;
forming first active patterns having a first pitch in the first region, second active patterns having a second pitch greater than the first pitch in the first region, third active patterns having a third pitch in the second region, and fourth active patterns having a fourth pitch greater than the third pitch in the second region, by etching the hardmask layer and at least a portion of the substrate using the second to fifth spacers as respective etching masks; and
forming a device isolation layer so that upper portions of the first to fourth active patterns protrude therefrom,
wherein a line width of each of the second to fourth photoresist patterns is greater than a line width of the first spacer, and a line width of the fourth photoresist pattern is greater than a line width of each of the second and third photoresist patterns.

18. The method of claim 17, wherein a distance between the second photoresist pattern and the first spacer disposed adjacent to the second photoresist pattern is smaller than a distance between the third photoresist pattern and the fourth photoresist pattern.

19. The method of claim 17, wherein in the forming of the first mandrels, the second sacrificial layer is entirely removed from the second region.

20. The method of claim 17, further comprising removing the second to fifth mandrels after the second to fifth spacers are formed, such that second spacers and third spacers having different pitches are retained in linear form in the first region, and fourth spacers and fifth spacers having different pitches are retained in linear form in the second region.

* * * * *